US012700567B2

(12) United States Patent
Zhang et al.

(10) Patent No.: US 12,700,567 B2
(45) Date of Patent: Aug. 4, 2026

(54) MULTI-STATE RF PULSING IN CYCLING RECIPES TO REDUCE CHARGING INDUCED DEFECTS

(71) Applicant: Lam Research Corporation, Fremont, CA (US)

(72) Inventors: He Zhang, Fremont, CA (US); Chen Li, San Jose, CA (US); Kevin Lai, San Jose, CA (US); Neil Macaraeg Mackie, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 329 days.

(21) Appl. No.: 18/689,825

(22) PCT Filed: Aug. 12, 2022

(86) PCT No.: PCT/US2022/040266
§ 371 (c)(1),
(2) Date: Mar. 6, 2024

(87) PCT Pub. No.: WO2023/038763
PCT Pub. Date: Mar. 16, 2023

(65) Prior Publication Data
US 2024/0242935 A1     Jul. 18, 2024

Related U.S. Application Data

(60) Provisional application No. 63/242,454, filed on Sep. 9, 2021.

(51) Int. Cl.
H01J 37/32 (2006.01)
H10P 50/28 (2026.01)

(52) U.S. Cl.
CPC .. H01J 37/32165 (2013.01); H01J 37/32146 (2013.01); H01J 2237/3341 (2013.01);
(Continued)

(58) Field of Classification Search
CPC ........... H01J 37/32165; H01J 37/32146; H01J 2237/3341; H01J 2237/3345;
(Continued)

(56) References Cited

U.S. PATENT DOCUMENTS 6,916,746 B1 * 7/2005 Hudson .................. H10P 50/283
438/712
8,546,264 B2 * 10/2013 Olynick ................ H10P 50/244
438/700
(Continued)

OTHER PUBLICATIONS

ISR & WO PCT/US2022/040266, dated Dec. 6, 2022, Total 11 pages.

*Primary Examiner* — Duy Vu N Deo
(74) *Attorney, Agent, or Firm* — Polygon IP, LLP

(57) ABSTRACT

A method for etching in plasma processing in a plasma chamber, including continually rotating between a first etch cycle and a second etch cycle for a period of time to etch a feature in a masked substrate. The method including performing the first etch cycle on the masked substrate using a first etching chemistry for a first sub-period. The first etch cycle is continually rotated between a first state configured for passivation, a second state, and third state configured for etching the masked substrate. During the second state of the first etch cycle, a first tuning step is performed by tuning the first etching chemistry, a high frequency RF power and a low frequency RF power to provide extended passivation to the feature in the masked substrate. The method including performing the second etch cycle on the masked substrate using a second etching chemistry for a second sub-period. The second etch cycle is continually rotated between the first state configured for electrical discharge, a fourth state, and the third state configured for etching the feature in the masked substrate. During the fourth state of the second etch cycle, a second tuning step is performed by tuning the
(Continued)

500 second etching chemistry, the high frequency RF power, and the low frequency RF power to provide punch-through etching to the feature in the masked substrate.

21 Claims, 20 Drawing Sheets

(52) U.S. Cl.
     CPC .................. *H01J 2237/3345* (2013.01); *H01J 2237/3347* (2013.01); *H01J 2237/3348* (2013.01); *H10P 50/283* (2026.01)

(58) Field of Classification Search
     CPC ....... H01J 2237/3347; H01J 2237/3348; H01J 37/32137; H10P 50/283
     USPC .......................................................... 216/76
     See application file for complete search history.

(56) References Cited

U.S. PATENT DOCUMENTS

| | | | |
|---|---|---|---|
| 9,412,608 B2 | 8/2016 | Wang et al. | |
| 9,872,373 B1 | 1/2018 | Shimizu et al. | |
| 9,997,373 B2 | 6/2018 | Hudson | |
| 2011/0139748 A1* | 6/2011 | Donnelly | H01J 37/32174 |
| | | | 216/37 |
| 2017/0178920 A1* | 6/2017 | Dole | H01J 37/32889 |
| 2017/0229312 A1 | 8/2017 | Samsung | |
| 2019/0148161 A1* | 5/2019 | Meng | H10P 50/244 |
| | | | 438/694 |

* cited by examiner

100A

100B

Figure 5:
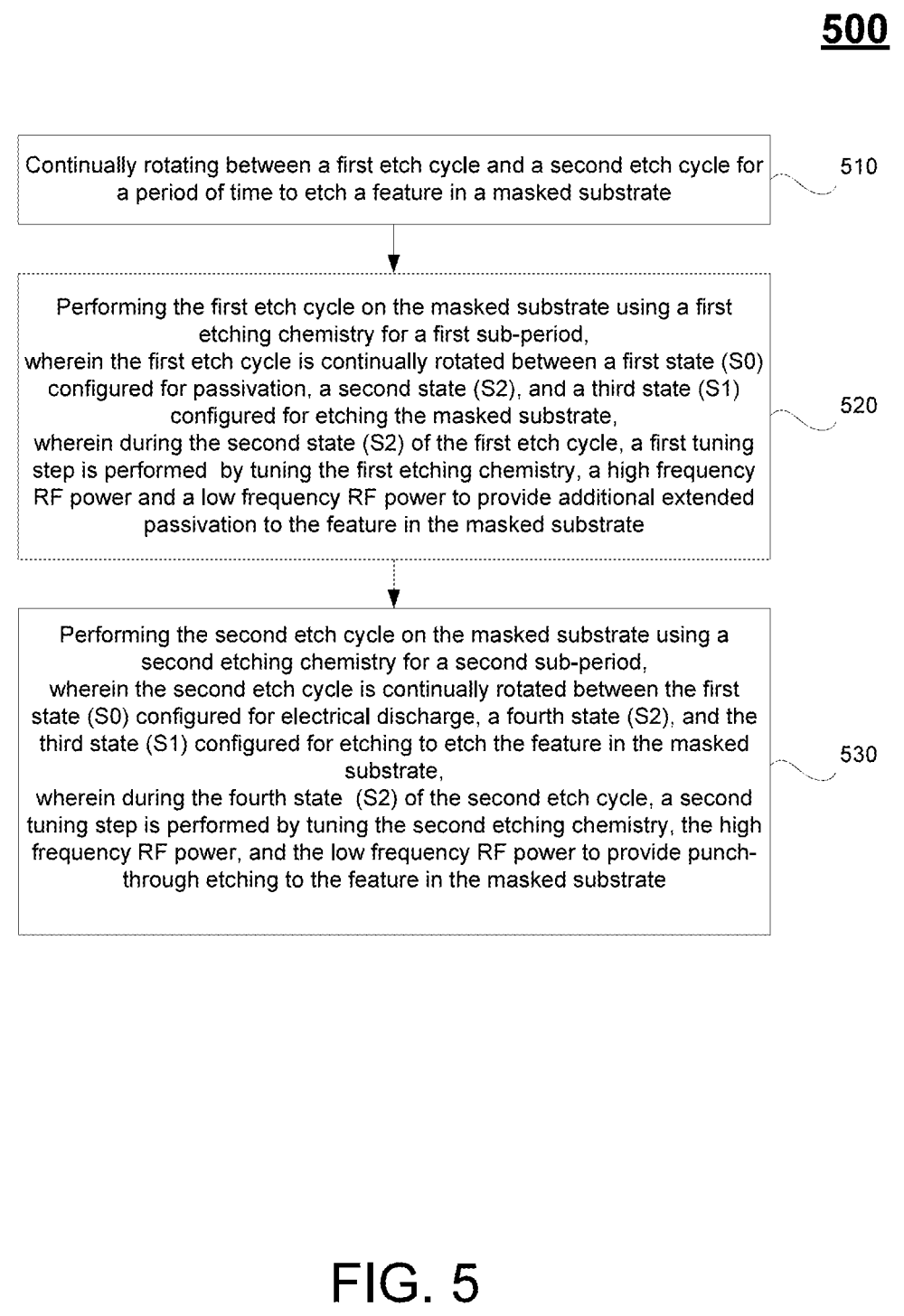

500

Continually rotating between a first etch cycle and a second etch cycle for a period of time to etch a feature in a masked substrate ⌇ 510

↓

Performing the first etch cycle on the masked substrate using a first etching chemistry for a first sub-period, wherein the first etch cycle is continually rotated between a first state (S0) configured for passivation, a second state (S2), and a third state (S1) configured for etching the masked substrate, wherein during the second state (S2) of the first etch cycle, a first tuning step is performed by tuning the first etching chemistry, a high frequency RF power and a low frequency RF power to provide additional extended passivation to the feature in the masked substrate ⌇ 520

↓

Performing the second etch cycle on the masked substrate using a second etching chemistry for a second sub-period, wherein the second etch cycle is continually rotated between the first state (S0) configured for electrical discharge, a fourth state (S2), and the third state (S1) configured for etching to etch the feature in the masked substrate, wherein during the fourth state (S2) of the second etch cycle, a second tuning step is performed by tuning the second etching chemistry, the high frequency RF power, and the low frequency RF power to provide punch-through etching to the feature in the masked substrate ⌇ 530

S2B
Low HF
High LF

S2B
Low HF
High LF
635

S2A
High HF
Low LF

S2A
High HF
Low LF
630

S0

S1

ME1

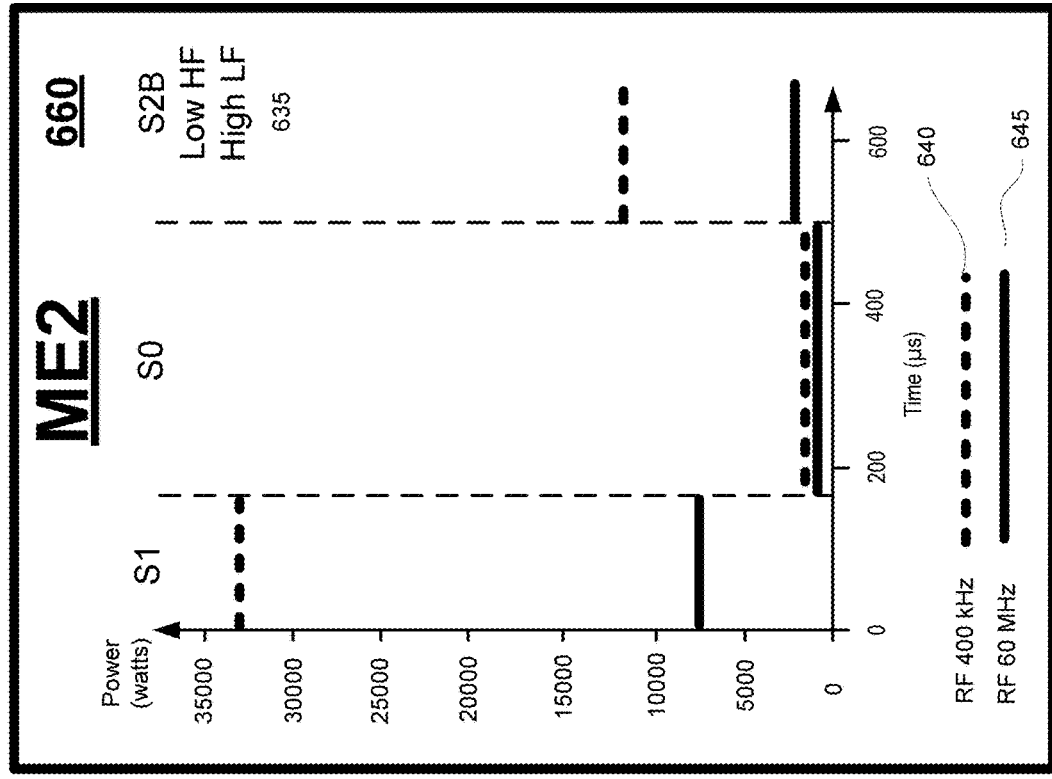
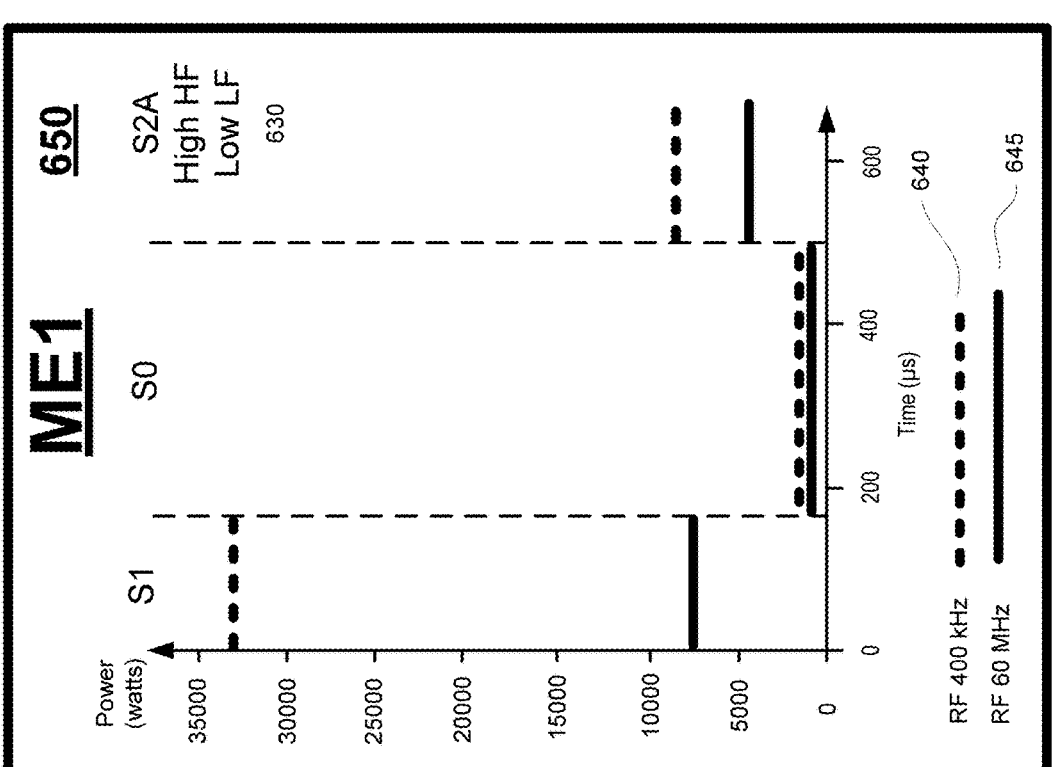
FIG. 6B

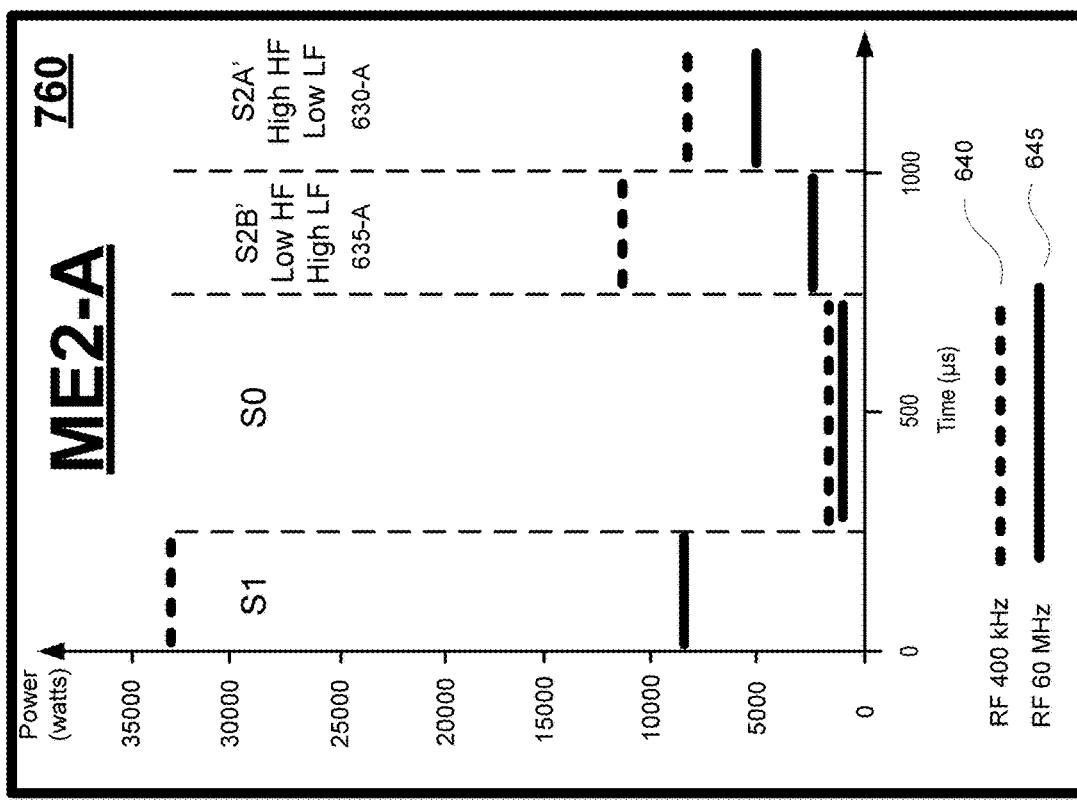
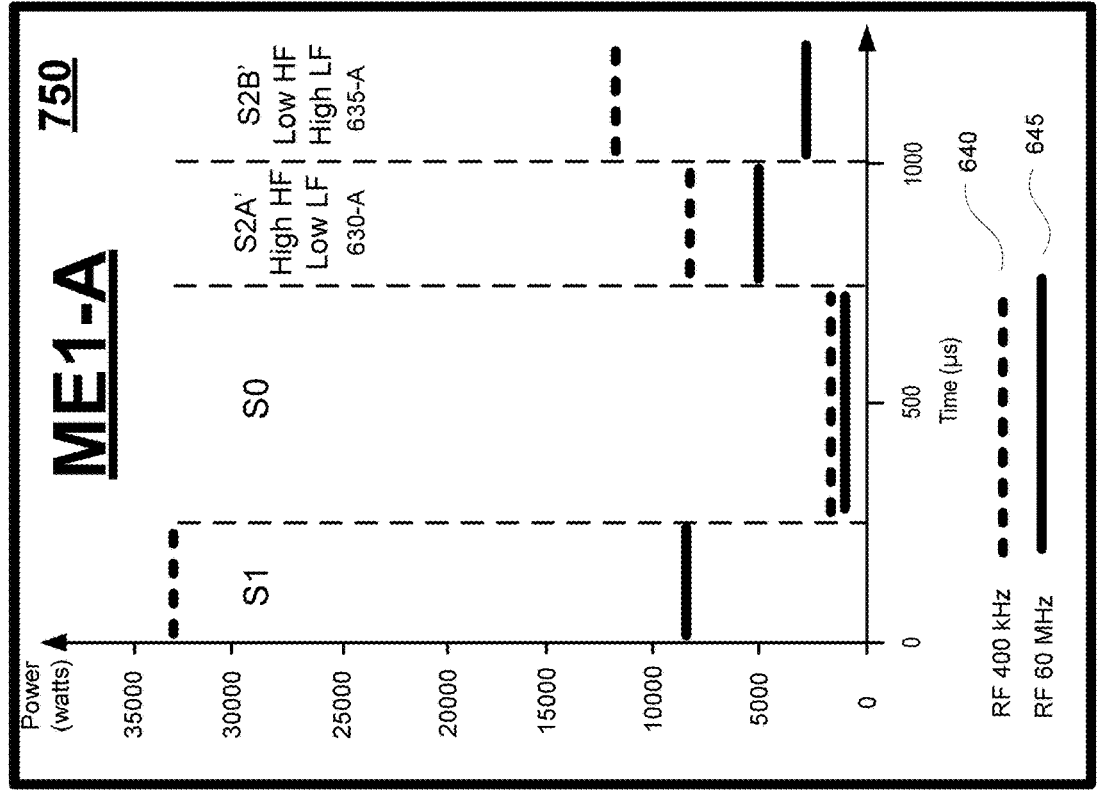
FIG. 7B

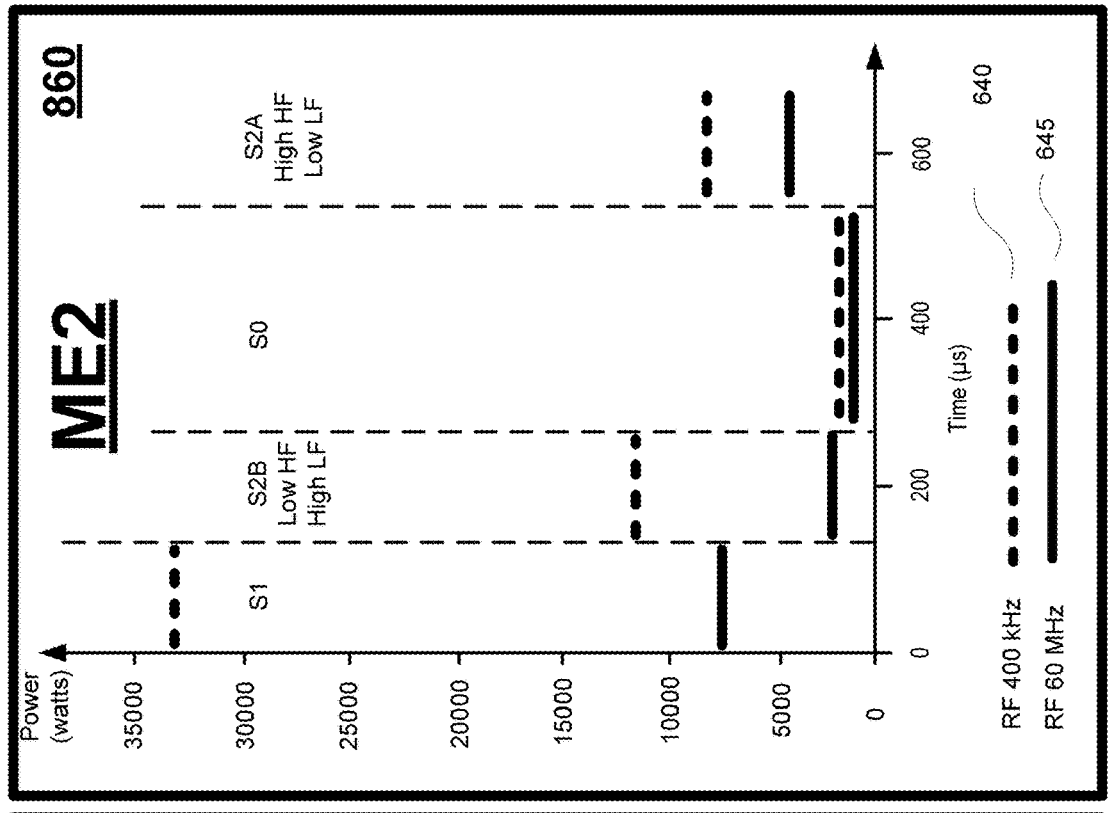
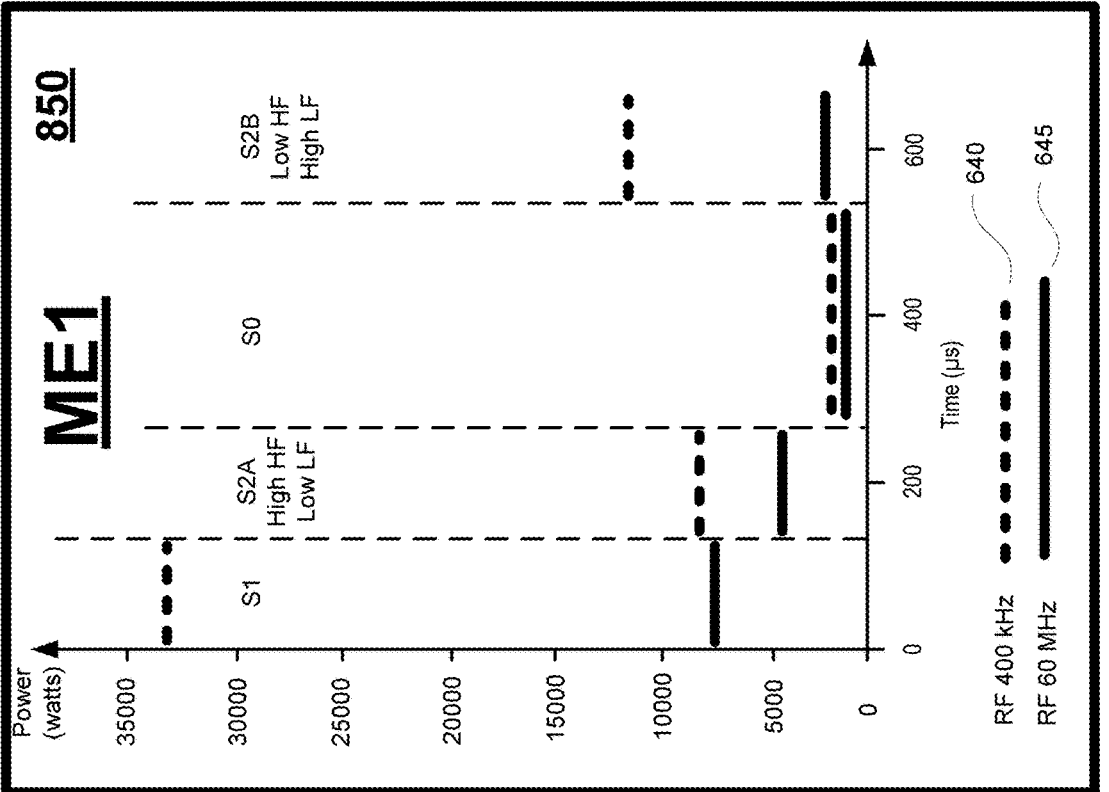
FIG. 8B

900

| Sequence | ME1' | | | | ME2' | | | |
|---|---|---|---|---|---|---|---|---|
| | State | State | State | State | State | State | State | State |
| 1 | S1 | S0 | S2A' | S2B' | S1 | S0 | S2B' | S2A' |
| 2 | S1 | S0 | S2B' | S2A' | S1 | S0 | S2A' | S2B' |
| 3 | S1 | S0 | S2A' | S2B' | S1 | S0 | S2A' | S2B' |
| 4 | S1 | S0 | S2B' | S2A' | S1 | S0 | S2B' | S2A' |
| 5 | S1 | S2A' | S0 | S2B' | S1 | S2B' | S0 | S2A' |
| 6 | S1 | S2B' | S0 | S2A' | S1 | S2A' | S0 | S2B' |
| 7 | S1 | S2A' | S0 | S2B' | S1 | S2A' | S0 | S2B' |
| 8 | S1 | S2B' | S0 | S2A' | S1 | S2B' | S0 | S2A' |
| 9 | S1 | S2A' | S2B' | S0 | S1 | S2B' | S2A' | S0 |
| 10 | S1 | S2B' | S2A' | S0 | S1 | S2A' | S2B' | S0 |

FIG. 9

MULTI-STATE RF PULSING IN CYCLING RECIPES TO REDUCE CHARGING INDUCED DEFECTS

CLAIM OF PRIORITY

This application is a national stage filing of and claims priority, under 35 U.S.C. § 371, to PCT/US2022/040266 filed on Aug. 12, 2022, and titled "MULTI-STATE RF PULSING IN CYCLING RECIPES TO REDUCE CHARGING INDUCED DEFECTS", which claims priority, under 35 U.S.C. § 119 (e), to U.S. Provisional Application No. 63/242,454 filed on Sep. 9, 2021, and titled "MULTI-STATE RF PULSING IN CYCLING RECIPES TO REDUCE CHARGING INDUCED DEFECTS", both of which are incorporated by reference herein in their entireties.

TECHNICAL FIELD

The present embodiments relate to methods and apparatus for fabricating a semiconductor device, and more particularly for etching high aspect ratio features into dielectric-containing material using mixed-mode multi-state radio frequency pulsing in cycling recipe to reduce in-feature charging induced defects during three-dimensional NAND memory slit etching, and multi-state RF pulsing with one or two plasma off states for in-feature second electron generation and charge neutralization.

BACKGROUND OF THE DISCLOSURE

The fabrication of semiconductor devices include the formation of recessed features (e.g., etched cylinder, via, trench, slit, etc.) in a stack of dielectric-containing material. For instance, these features may be formed during fabrication of three dimensional (3D) NAND memory structures including the 3D vertical stacking of transistors. As device dimensions become smaller and stack dimensions become larger (e.g., increasing stack layers) to achieve higher transistor density in three dimensions and better performance (e.g., faster, lower power consumption, etc.), features with high aspect ratios become increasingly difficult to etch uniformly without introducing in-feature defects.

For example, in-feature charge accumulation is a common challenge for high aspect ratio (HAR) dielectric etch, wherein HAR may be defined as the ratio between the depth and width of a corresponding feature (e.g., HARs greater than 20). As HAR increases to beyond 50 or more, the in-feature charge is difficult to be released during high ion energy/flux plasma etching, for example. This charging accumulation during plasma etch may cause etching profile distortions, including profile twisting, profile tilting, dimple distortion, uneven lateral etching, and surface roughening of features. Charging of the feature surface can also lead to interference between patterns, which causes pattern dependent distortion (e.g., at transition areas). The 3D NAND slit etching is one of the final steps in the dielectric etch workflow and thus has very tight critical dimension (CD) tolerances in order to prevent interaction (clipping) of existing features such as memory holes. The in-feature charge can cause etching defects at a slit dimple, including charge accumulation near the memory holes which may lead to slit (e.g., slit dimple) pointy defects, and charge at the memory hole density change area (e.g., transition location between core and dummy areas) which may produce slit transition area wiggling.

Some existing methods to remove slit dimple defects include the reduction of global ion tilt. Although these methods may remove dimple defects to some extent, there is a tradeoff including increased charge accumulation. For example, with high in-feature charge accumulation, ion trajectory may be deflected, which gives a much narrower processing window for making global ion tilt adjustments, and/or other adjustments.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure It is in this context that embodiments of the disclosure arise.

SUMMARY

The present embodiments relate to methods and apparatus for etching high aspect ratio features in a stack including dielectric material, such as when performing etching (e.g., slit etching) into a stack during fabrication of a 3D stacked semiconductor (e.g., NAND) structures on a substrate. Several inventive embodiments of the present disclosure are described below.

Embodiments of the present disclosure provide for a method for etching in plasma processing in a plasma chamber. The method including continually rotating between a first etch cycle and a second etch cycle for a period of time to etch a feature in a masked substrate. For example, the masked substrate may include a stack of a plurality of dielectric layers and a mask layer that is patterned on top of the stack. The method including performing the first etch cycle on the masked substrate using a first etching chemistry for a first sub-period. The first etch cycle is continually rotated between a first state (S0) configured for passivation, a second state (S2), and third state (S1) configured for etching the masked substrate. During the second state (S2) of the first etch cycle, a first tuning step is performed by tuning the first etching chemistry, a high frequency RF power and a low frequency RF power to provide extended passivation to the feature in the masked substrate. The method including performing the second etch cycle on the masked substrate using a second etching chemistry for a second sub-period. The second etch cycle is continually rotated between the first state (S0) configured for electrical discharge, a fourth state (S2), and the third state (S1) configured for etching the feature in the masked substrate. During the fourth state (S2) of the second etch cycle, a second tuning step is performed by tuning the second etching chemistry, the high frequency RF power, and the low frequency RF power to provide punch-through etching to the feature in the masked substrate.

Other embodiments of the present disclosure provide for a method for multi-state RF pulsing in plasma processing. The method including providing an etching chemistry to a plasma chamber. The method including continually rotating between a first state (S0) configured for negative ion transportation for charge neutralization of a feature, a second state (S2), and a third state (S1) configured to etch the feature in a masked substrate including a stack of a plurality of dielectric layers and a mask layer that is patterned on top of the stack. During the second state (S2), the etching chemistry, a high frequency radio frequency (RF) power, and a low frequency RF bias power are tuned to provide passivation to the feature in the masked substrate. During the first state (S0), a low frequency RF power generator is set to a first off-state to prevent delivery of the low frequency RF power to the masked substrate. During the first state (S0), a high frequency RF power generator is set to a second off-state to prevent delivery of the high frequency RF power to the masked substrate.

Still other embodiments of the present disclosure provide for a method for multi-state RF pulsing in plasma processing. The method including providing an etching chemistry to a plasma chamber. The method including continually rotating between a first state (S0-A) configured for negative ion transportation for charge neutralization of a feature, a second state (S2), and a third state (S1) configured to etch the feature in a masked substrate, and a fourth state (S0-B) configured for additional negative ion transportation for charge neutralization of the feature. During the second state (S2), the etching chemistry, a high frequency radio frequency (RF) power, and a low frequency RF bias power are tuned to provide passivation to the feature in the masked substrate including a stack of a plurality of dielectric layers and a mask layer that is patterned on top of the stack. During the first state (S0), a low frequency RF power generator is set to a first off-state to prevent delivery of the low frequency RF power to the masked substrate. During the first state (S0-A) or the fourth state (S0-B), a high frequency RF power generator is set to a second off-state to prevent delivery of the high frequency RF power to the masked substrate.

These and other advantages will be appreciated by those skilled in the art upon reading the entire specification and the claims.

BRIEF DESCRIPTION OF THE DRAWINGS

The embodiments may best be understood by reference to the following description taken in conjunction with the accompanying drawings.

FIG. 5 is a flow diagram illustrating a method for etching a feature in a stack including dielectric material such as when fabricating a 3D NAND structure on a substrate, including mixed mode, multi-state pulsing, in accordance with one embodiment of the present disclosure.

FIG. 6A is a diagram illustrating two cycling stages having different cycling recipes each with three pulsed RF power states that is used in a mixed mode, multi-state pulsing process for etching a feature in a stack including dielectric material such as when fabricating a 3D NAND structure on a substrate, in accordance with one embodiment of the present disclosure.

FIG. 6B is a diagram illustrating power levels applied during a mixed mode, multi-state pulsing process of FIG. 6A for etching a feature in a stack including dielectric material such as when fabricating a 3D NAND structure on a substrate, in accordance with one embodiment of the present disclosure.

FIG. 7B is a diagram illustrating power levels applied during a mixed mode, multi-state pulsing process of FIG. 7A for etching a feature in a stack including dielectric material such as when fabricating a 3D NAND structure on a substrate, in accordance with one embodiment of the present disclosure.

FIG. 8B is a diagram illustrating power levels applied during a mixed mode, multi-state pulsing process of FIG. 8A for etching a feature in a stack including dielectric material such as when fabricating a 3D NAND structure on a substrate, in accordance with one embodiment of the present disclosure.

FIG. 9 is a table illustrating various combinations of cycling recipes using in two cycling stages having different cycling recipes each with four pulsed RF power states that is used in a mixed mode, multi-state pulsing process for etching a feature in a stack including dielectric material such as when fabricating a 3D NAND structure on a substrate, in accordance with one embodiment of the present disclosure.

DETAILED DESCRIPTION

Figure 1A:
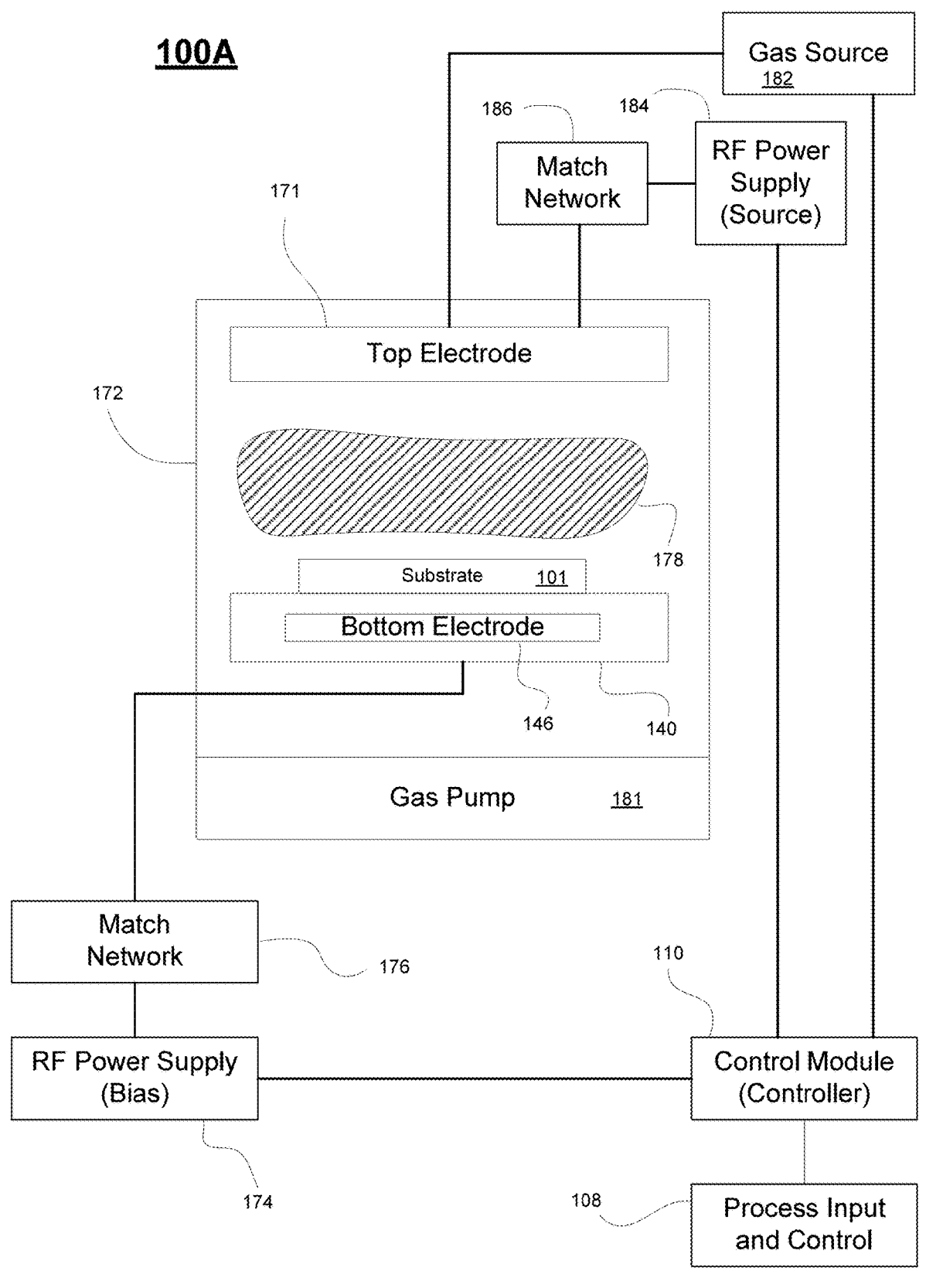
FIG. 1A illustrates a substrate processing system, which is used to process a wafer, e.g., for performing etching, in accordance with one embodiment of the present disclosure.

Although the following detailed description contains many specific details for the purposes of illustration, anyone of ordinary skill in the art will appreciate that many variations and alterations to the following details are within the scope of the present disclosure. Accordingly, the aspects of the present disclosure described below are set forth without any loss of generality to, and without imposing limitations upon, the claims that follow this description.

Generally speaking, the various embodiments of the present disclosure describe methods and apparatus for etching high aspect ratio features into dielectric-containing material when fabricating semiconductor devices. The etching process is performed using mixed-mode, multi-state RF pulsing in two cycling stages and/or multi-state RF pulsing with one or two plasma off states for in-feature second electron generation and charge neutralization to reduce in-feature charging induced defects during three-dimensional NAND memory slit etching. In particular, different low frequency to high frequency RF power ratios are applied to different cycling stages and/or recipes during one or more flux and voltage extension states, wherein multi-state RF pulsing is performed in each of the cycling stages. The mixed-mode, multi-state RF pulsing recipe applied during different cycling stages breaks the tradeoff between applying flux and/or voltage extension states. That is, cycling multi-state RF pulsing together with chemistry cycling (i.e., using different etching chemistries in different cycling stages) provides for an effective control tuning mechanism or knob during an etching process, such as when performing slit etching when fabricating NAND semiconductor devices. This reduces charging induced defects (e.g., profile twisting, dimple distortion, etc.) in features to enable sidewall modifications that achieve reduced critical dimensions of features, and improved bottom/bowing ratios. In addition, another etching process is performed using multi-state RF pulsing with one or two plasma off states for in-feature second electron generation and charge neutralization (e.g., releasing in-feature accumulated charge), which suppresses the dimple pointy defects and minimizes the slit transition area wiggling. This reduces the impact of charge accumulation producing dimple defects when performing high aspect ratio dielectric plasma etching. In particular, adding one or two plasma OFF states in multi-state RF pulsing minimizes in-feature charge accumulation, and enables a larger processing window for polymer tuning, enables slit neck opening, assists with in-feature second electron generation, and increases the efficiency of charge neutralization (i.e., increases charge neutralization) during the plasma OFF state. These further reduce pointy defects and slit wiggling, all of which result in uniform etching of slit dimples.

Advantages of the various embodiments, disclosing methods and apparatus for etching high aspect ratio features into dielectric-containing material when fabricating semiconductor devices using mixed-mode, multi-state RF pulsing in two cycling stages and/or multi-state RF pulsing with one or two plasma off states results in the best combination of second electron generation and transportation in order to minimize slit in-feature charge, and for reducing charge induced defects (e.g., profile twisting, dimple distortion, lateral etching, etc.). Highly efficient secondary electron production and in-feature transportation, as achieved through embodiments of the present disclosure, are required to minimize the deleterious effects of charge accumulation, especially as the high aspect ratio for slit features in 3D NAND devices continues to increase.

With the above general understanding of the various embodiments, example details of the embodiments will now be described with reference to the various drawings. Similarly numbered elements and/or components in one or more figures are intended to generally have the same configuration and/or functionality. Further, figures may not be drawn to scale but are intended to illustrate and emphasize novel concepts. It will be apparent, that the present embodiments may be practiced without some or all of these specific details. In other instances, well-known process operations have not been described in detail in order not to unnecessarily obscure the present embodiments.

FIG. 1A illustrates an exemplary substrate processing or reactor system 100A, which may be used to process a wafer, to include etching features within masked substrates, such as when performing high aspect ratio dielectric etch, in accordance with one embodiment of the present disclosure. For example, the features may be etched in a stack including dielectric material when fabricating a 3D NAND structure on a substrate. More particularly, the substrate processing system 100 is used to process wafer 101, such as by performing plasma processing of the wafer 101, and may be modified depending on design to generate plasmas through various methods, including capacitively coupled plasmas (CCPs), inductively coupled plasmas (ICPs) including inductive coils used for exciting a plasma instead of an electrode, etc.

As shown, the system 100A includes a plasma chamber 172, which is a CCP chamber. The plasma chamber 172 includes a substrate support or pedestal 140, such as an electrostatic chuck (ESC), or magnetic chuck. A bottom electrode 146 may be embedded within the pedestal 140. A substrate 101 may be placed on the pedestal 140 for processing, wherein the substrate 101 is processed to make one or more semiconductor chips. Facing the pedestal is a top electrode 171 of the plasma chamber 172. Between the top electrode 171 and the bottom electrode 146 is a gap forming a processing volume within which a plasma 178 may be formed. A gas pump 181 is used to remove gases and byproducts from the plasma chamber 172.

A control module 110 is configured to operate the substrate processing system 100A by executing process input and control 108. Depending on the processing being performed, the control module 110 controls the delivery of process gases delivered from the gas source 182 to achieve a designed processing condition. The chosen gases are then distributed in a space volume defined between the top electrode 171 and the wafer 101 resting over pedestal 140. In particular, the process input and control 108 may include process recipes, such as power levels, timing parameters, process gases, mechanical movement of the wafer 101, etc., such as to etch features in stack structures of a wafer 101 and/or deposit or form films over the wafer 101. In particular, control module 110 may be configured to operate the substrate processing system 100 to perform etching of high aspect ratio features in a stack of a masked substrate, to include tuning the composition of the etching chemistry in various cycling stages, and pulsing parameters of an RF power supply 184 (e.g., source generator) and a bias RF power supply 174.

A source RF power supply 184 (e.g., source power generator) is coupled to an impedance match network 186 that is further coupled to the plasma chamber 172, wherein the match network matches impedances between the load (e.g., plasma chamber and any connecting cabling) and a source (e.g., source RF power supply and any connecting cabling). In particular, the impedance match network 186 is coupled to a top electrode 171 located within the plasma chamber 172. The source RF power supply 184 is used typically to generate the plasma 178 using the process gases delivered from the gas source 182.

The system 100A includes a bias RF power supply 174 (e.g., bias power generator) that is coupled to an impedance match network 176 that is further coupled to the plasma chamber 172, wherein the match network matches impedances between the load (e.g., plasma chamber and any connecting cabling) and a source (e.g., bias RF power supply and any connecting cabling). In particular, the impedance match network 176 is coupled to the bottom electrode 146 located within the plasma chamber 172 (e.g., within the pedestal 140). The bias RF power supply 174 is typically used to control ion distribution (e.g., more vertical ion bombardment of the substrate to achieve higher vertical etch rates in order to perform anisotropic etching).

For illustration, the bias RF power supply 174 may be operating at a frequency between approximately 20 kilohertz (kHz) to approximately 13 megahertz (MHz), and in one particular case is operating at 400 kHz, at an RF power level between about 0 Watts to 40 kilowatts (KW) per substrate. As a further example, the source RF power supply 184 may be operating at a frequency between approximately 13 MHZ to approximately 100 MHZ, and in one particular case is operating at 60 MHz, and at a power level between about 0 watts (W) to 15 kilowatts (KW).

As shown, the substrate processing system 100A may be configured to deliver RF power at two frequencies, to include RF power at one frequency (e.g., excitation frequency for plasma generation) that is sourced from the RF power supply 184 and a RF bias power at another frequency that is sourced from bias RF power supply 174. Delivery of the two RF powers is performed to generate plasma from the process gases including one or more fluorocarbons and/or hydrofluorocarbons, and others. Generally. RF power delivered at a higher frequency is used to generate the plasma within the chamber 172, and the RF bias power at a lower frequency is used to control ion distribution (e.g., more vertical ion bombardment of the substrate to achieve higher vertical etch rates in order to perform anisotropic etching). For example, the plasma may be generated and exposed to the masked substrate in the chamber 102 to perform etching of a feature in a stack of a masked substrate (e.g., patterned mask layer with openings where the high aspect ratio features are to be etched). In addition, in embodiments of the present disclosure the delivery of both RF power may be pulsed with varying patterns at different cycling stages to achieve more uniform etching throughout the entire profile of a feature within a stack of a masked substrate, thereby reducing the effects of profile twisting, bowing, profile tilting, dimple distortion, and uneven lateral etching, as will be described more fully below in the following figures.

In another embodiment, the system 100A may be configured to provide source RF power to the bottom electrode 146. In that case, the source RF power supply 184 (e.g., source power generator) is coupled to the impedance match network 186 that is further coupled to the bottom electrode 146. Also, the top electrode may be coupled to ground to facilitate a return of the RF energy. The remaining components are similarly configured as previously described, such as having the bias RF power supply 174 (e.g., bias power generator) being coupled to the impedance match network 176 that is further coupled to the bottom electrode 146.

Figure 1B:
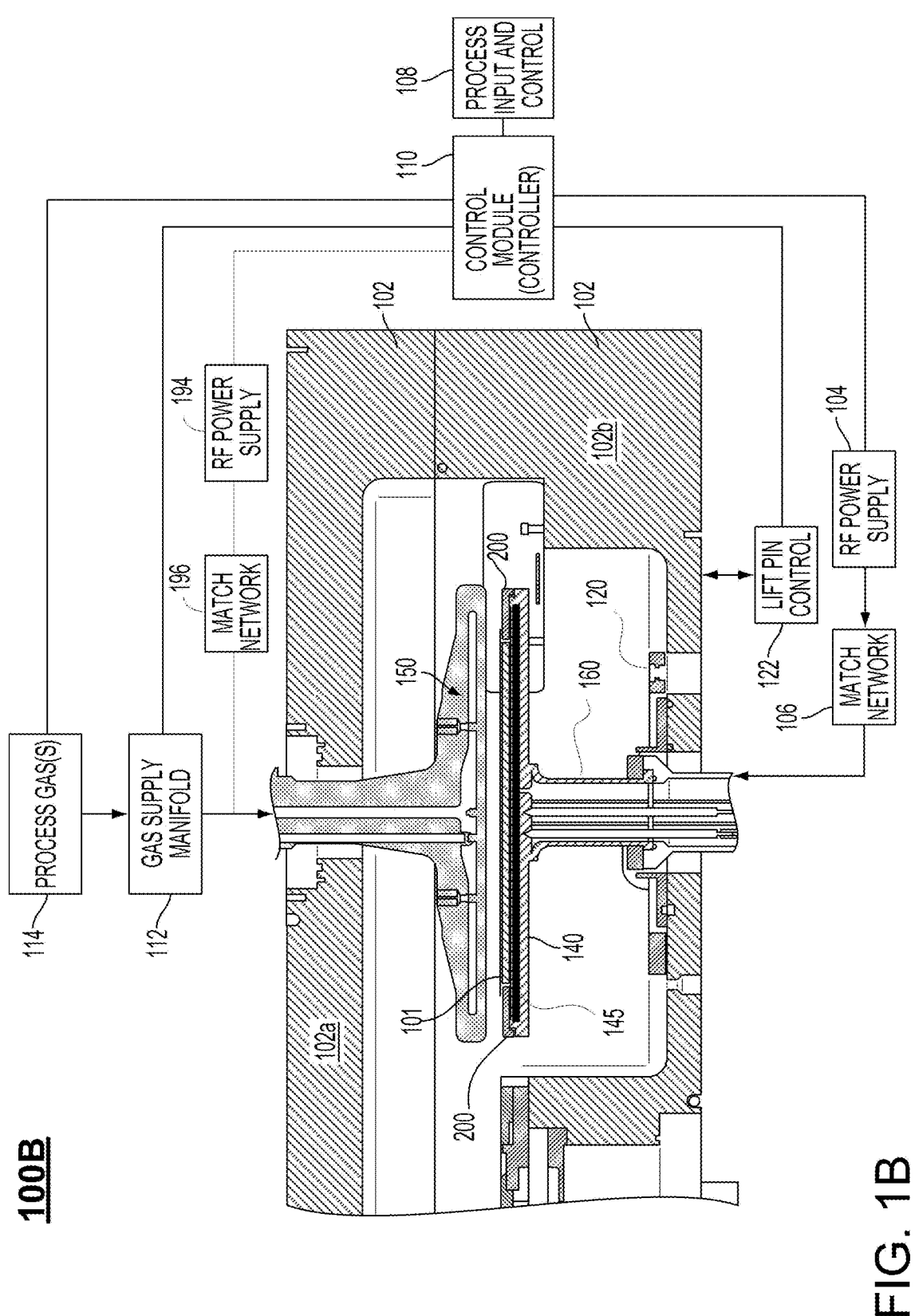
FIG. 1B illustrates a substrate processing system, which is used to process a wafer, e.g., to form films thereon, in accordance with one embodiment of the present disclosure.

FIG. 1B illustrates a substrate processing or reactor system 100B, which may be used to process a wafer, to include depositing films. For example, the features may be etched in a stack including dielectric material when fabricating a 3D NAND structure on a substrate. More particularly, the substrate processing system 100 is used to process wafer 101, such as by performing plasma processing of the wafer 101, and may be modified depending on design to generate plasmas through various methods, including capacitively coupled plasmas (CCPs), inductively coupled plasmas (ICPs), etc.

In particular, system 100B includes a chamber 102 having a lower chamber portion 102b and an upper chamber portion 102a. A center column is configured to support a pedestal 140, which in one embodiment is a powered electrode.

A control module 110 is configured to operate the substrate processing system 100B by executing process input and control 108. Depending on the processing being performed, the control module 110 controls the delivery of process gases 114 via the gas supply manifold 112 that is connected to the process gases 114 (e.g., gas chemistry supplies from a facility) to achieve a designed processing condition. The chosen gases are then flown into the shower head 150 and distributed in a space volume defined between a face of a showerhead 150 that faces the wafer 101 and the wafer resting over pedestal 140. In particular, the process input and control 108 may include process recipes, such as power levels, timing parameters, process gases, mechanical movement of the wafer 101, etc., such as to etch features in stack structures of a wafer 101 and/or deposit or form films over the wafer 101. In particular, control module 110 may be configured to operate the substrate processing system 100 to perform deposition of films on a substrate, to include tuning the composition of the deposition chemistry in various cycling stages, and pulsing parameters of an RF power source 194 and an RF bias power source 104.

Further, the gases may be premixed or not. Appropriate valving and mass flow control mechanisms may be employed to ensure that the correct gases are delivered during the deposition and plasma treatment phases of the process. Process gases exit chamber via an outlet. A vacuum pump (e.g., a one or two stage mechanical dry pump and/or a turbomolecular pump) draws process gases out and maintains a suitably low pressure within the reactor by a close loop controlled flow restriction device, such as a throttle valve or a pendulum valve.

As shown, the substrate processing system 100B may be configured to deliver RF power at two frequencies, to include RF power at one frequency (e.g., excitation frequency for plasma generation) that is sourced from the RF power supply 194 and a RF bias power at another frequency that is sourced from RF power supply 104. Delivery of the two RF powers is performed to generate plasma from the process gases 114 including one or more fluorocarbons and/or hydrofluorocarbons, and others. Generally. RF power delivered at a higher frequency is used to generate the plasma within the chamber 102, and the RF bias power at a lower frequency is used to control ion distribution (e.g., more vertical ion bombardment of the substrate to achieve higher vertical etch rates in order to perform anisotropic etching). For example, the plasma may be generated and exposed to the masked substrate in the chamber 102 to perform deposition processes. In addition, in embodiments of the present disclosure the delivery of both RF power may be pulsed with varying patterns at different cycling stages.

In particular, a showerhead 150 is electrically coupled to an RF power supply 194 via an RF match network 196. The RF power supply 194 is controlled by the control module 110 (e.g., a controller) to apply RF power to the showerhead 150. For example, the plasma RF power provided to the showerhead 150 may be delivered at a frequency between about 20-100 MHz (e.g., 60 MHz in a particular case) and at a power level between about 0 watts (W) to 15 kilowatts (KW).

Also, pedestal 140 is electrically coupled to power supply 104 via a match network 106. The power supply is controlled by the control module 110 (e.g., a controller) to apply an RF bias power to the pedestal 140. For example, the substrate may be biased at a frequency between about 20 kHz and 1.5 MHz at an RF power level between about 0 Watts to 40 kilowatts (kW) per substrate.

The center column (e.g., also known as central shaft or spindle) 160 may interface with lift pins (not shown), each of which is actuated by a corresponding lift pin actuation ring 120 as controlled by lift pin control 122. The lift pins are used to raise the wafer 101 from the pedestal 140 to allow a robot arm (e.g., an end-effector, etc.) to deliver (e.g., load) a wafer to the process chamber and/or to remove (e.g., unload) a wafer from the process chamber 250.

The substrate processing system 100B may include multiple processing stations. For example, chamber 102 may include multiple processing stations, each station having a pedestal for supporting a wafer 101. The RF match network 106 may be coupled to an RF distribution system 420 that supplies power to the system 100B. For example, the RF power and frequency supplied by matching network 106 is split and distributed by the distribution system 420 to each of the stations. Also, the RF power being delivered to a station is passed through a VI probe 417 for sensing a voltage of the showerhead, during operation. In that manner, the RF power may be adjusted at each station for balanced power delivery, or for desired power delivery.

Also shown is a carrier ring 200 that encircles an outer region of the pedestal 140. The carrier ring 200 is configured to sit over a carrier ring support region that is a step down from a wafer support region in the center of the pedestal 140. The carrier ring includes an outer edge side of its disk structure, e.g., outer radius, and a wafer edge side of its disk structure, e.g., inner radius, that is closest to where the wafer 101 sits. The wafer edge side of the carrier ring includes a plurality of contact support structures which are configured to lift the wafer 101 when the carrier ring 200 is lifted by spider forks 180. The carrier ring 200 is therefore lifted along with the wafer 101 and can be rotated to another station, e.g., in a multi-station system. In other embodiments, the chamber is a single station chamber.

Figures 2A, 2B:
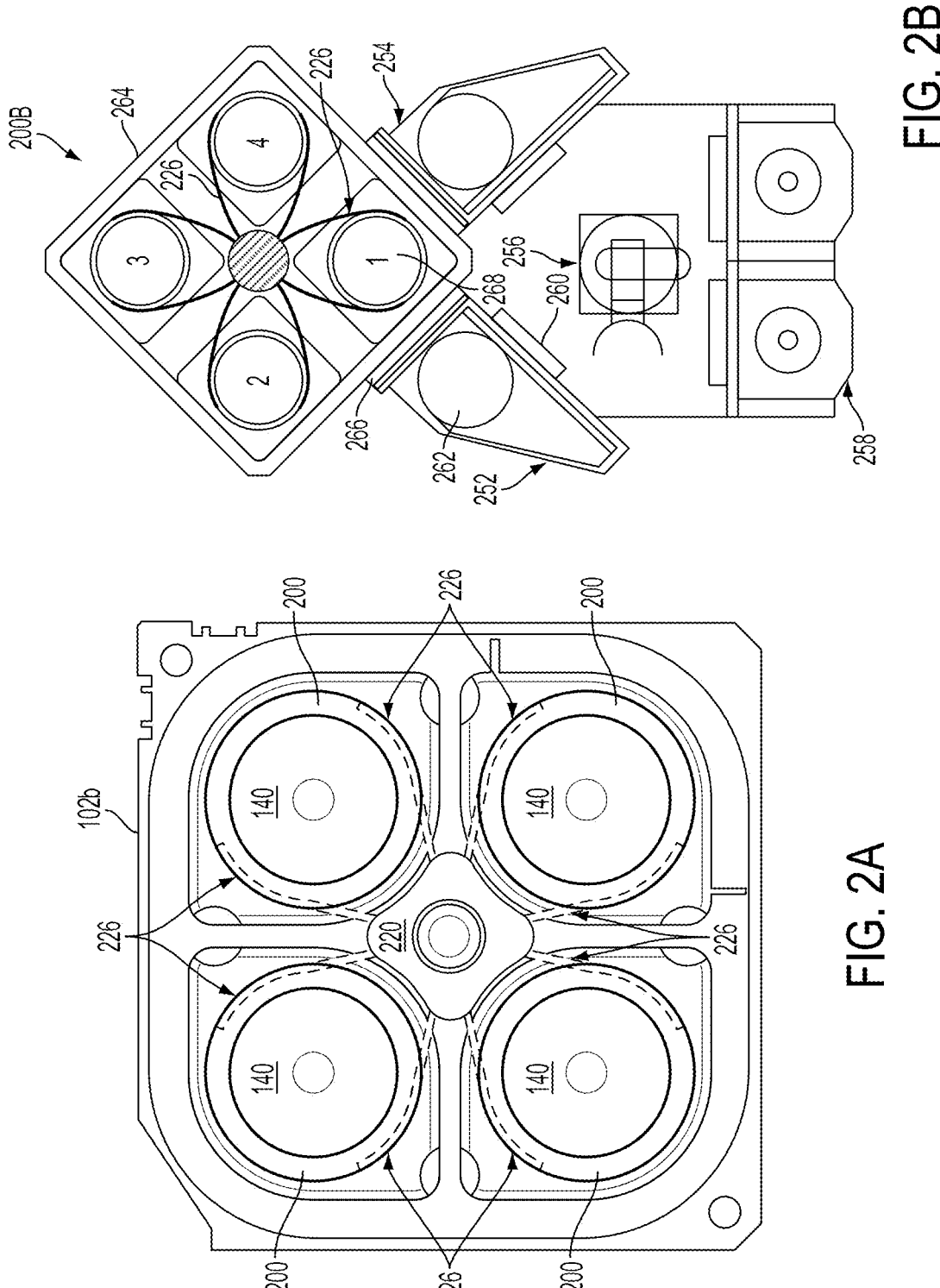
FIG. 2A illustrates a top view of a multi-station processing tool, wherein four processing stations are provided, in accordance with one embodiment.
FIG. 2B shows a schematic view of an embodiment of a multi-station processing tool with an inbound load lock and an outbound load lock, in accordance with one embodiment.

FIG. 2A illustrates a top view of a multi-station processing tool, wherein four processing stations are provided. This top view is of the lower chamber portion 102b (e.g., with the top chamber portion 102a removed for illustration), wherein four stations are accessed by spider forks 226. Each spider fork, or fork includes a first and second arm, each of which is positioned around a portion of each side of the pedestal 140. In this view; the spider forks 226 are drawn in dashlines, to convey that they are below the carrier ring 200. The spider forks 226, using an engagement and rotation mechanism 220 are configured to raise up and lift the carrier rings 200 (i.e., from a lower surface of the carrier rings 200) from the stations simultaneously, and then rotate at least one or more stations before lowering the carrier rings 200 (where at least one of the carrier rings supports a wafer 101) to a next location so that further plasma processing, treatment and/or film deposition can take place on respective wafers 101. In other embodiments, a ringless wafer system may be configured for wafer transfer between stations without the use of a carrier ring.

FIG. 2B shows a schematic view of an embodiment of a multi-station processing tool 200B with an inbound load lock 252 and an outbound load lock 254. A robot 256, at atmospheric pressure, is configured to move substrates from a cassette loaded through a pod 258 into inbound load lock 252 via an atmospheric port 260. Inbound load lock 252 is coupled to a vacuum source (not shown) so that, when atmospheric port 260 is closed, inbound load lock 252 may be pumped down. Inbound load lock 252 also includes a chamber transport port 266 interfaced with processing chamber 102b. Thus, when chamber transport 266 is opened, another robot (not shown) may move the substrate from inbound load lock 252 to a pedestal 140 of a first process station for processing.

The depicted processing chamber 102b comprises four process stations, numbered from 1 to 4 in the embodiment shown in FIG. 3. In some embodiments, processing chamber 102b may be configured to maintain a low pressure environment so that substrates may be transferred using a carrier ring 200 among the process stations without experiencing a vacuum break and/or air exposure. Each process station depicted in FIG. 3 includes a process station substrate holder (shown at 268 for station 1) and process gas delivery line inlets.

Also shown are spider forks 226 configured for transferring substrates within processing chamber 102b. The spider forks 226 rotate and enable transfer of wafers from one station to another. The transfer occurs by enabling the spider forks 226 to lift carrier rings 200 from an outer undersurface, which lifts the wafer, and rotates the wafer and carrier together to the next station. In one configuration, the spider forks 226 are made from a ceramic material to withstand high levels of heat during processing.

Figure 3B:
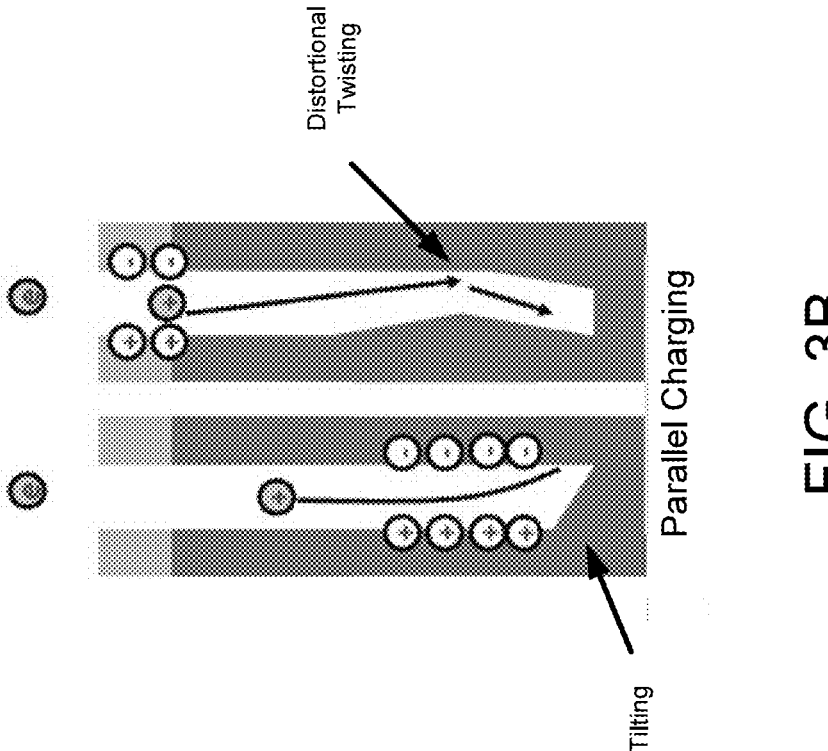
FIG. 3B shows parallel charging modes having unwanted deflection of ion trajectory leading to tilting at the bottom of a feature, and/or distortional twisting throughout a profile of a feature.
Figure 3A:
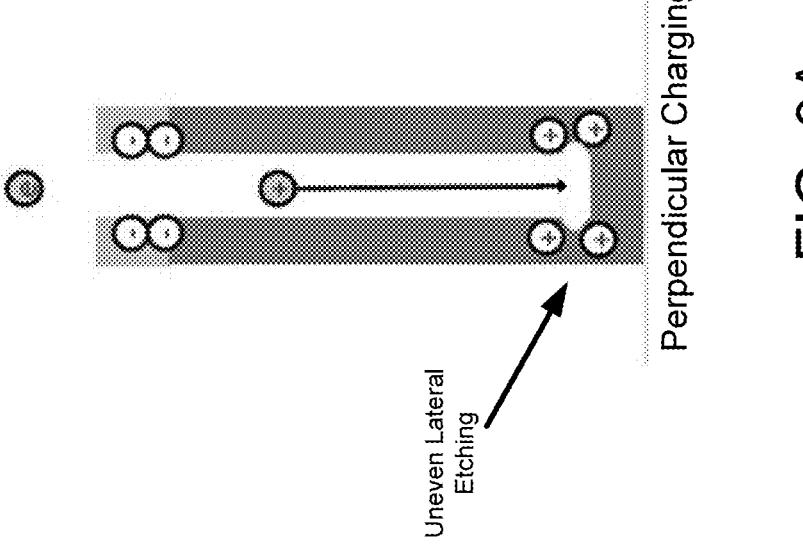
FIG. 3A shows a perpendicular charging mode contributing to unwanted lateral etching at the bottom of a feature.

FIGS. 3A and 3B show how perpendicular and parallel charging modes/mechanisms occurring when pulsing multiple power sources under varying patterns for different cycling stages performed during an etching process of a feature within a stack of a masked substrate deleteriously affect the profile of the feature (e.g., hole, slit, etc.). For example, the charging mechanisms if not corrected may alter the flow of reactive etchants and/or charge particles (e.g., accumulation of charge at the top or bottom of the feature), resulting in etching profile distortions, including profile twisting, profile tilting, dimple distortion, uneven lateral etching, and surface roughening of the features. Without wishing to be bound by theory or mechanism of action, it is believed that existence of parallel and perpendicular charging exists and causes various performance observations of the slit feature (e.g., etching profile distortions). For example, parallel charging could deflect ions, and perpendicular charging would slow ions down causing the etching profile distortions. Embodiments of the present disclosure mitigates the effects of charging defects by providing for charge release of in-feature charge accumulation, to reduce the effects of etching profile distortions, such as for controlling dimple defects in features (e.g., slits, channels holes, etc.).

In particular. FIG. 3A shows a perpendicular charging mechanism contributing to unwanted lateral etching at the bottom of a feature. As shown, there is an accumulation of negative charge at the top of the feature (e.g., slit, channel hole, etc.) and accumulation of positive charge at the bottom of the feature. Some contributing charge may also be trapped in materials. This in-feature charge accumulation may cause ions generated for ion bombardment to slow down and contribute to undesired lateral etching (i.e., reduced vertical etching), especially at the bottom of the feature, and also may reduce the overall efficiency of ion bombardment from the plasma (e.g., originating in the sheath). For example, a slit transition from a core array area to a dummy channel hole (CH) area may easily be wiggled or broken (e.g., "mousebites"). This may be due to charge induced uneven electric field distribution at the transition (e.g., area where the CH density changes). Also, the in-feature charge accumulation near a channel hole may also contribute to pointy defects (e.g., in the slit) at the boundary between a slit and core array area (e.g., location of channel holes). Further, the in-feature charge accumulation may provide an undesired narrower process window for global ion tilt and polymer distribution control that is unwanted.

FIG. 3B shows a parallel charging mechanism having undesired deflection of the ion trajectory. As shown, in one case there is an accumulation of negative charge on one side (e.g., left side) of a feature, and an accumulation of positive charge on the other side (e.g., right side of the feature) that is concentrated at the bottom of a feature. In another case, there is an accumulation of negative charge on one side of a feature, and an accumulation of positive charge on the other side that is concentrated at the top of a feature. Some contributing charge may also be trapped in materials. In both cases, the trajectory of the ions generated for ion bombardment are deflected due to the charged surfaces of the in-feature charge accumulation, which may lead to tilting at the bottom of the feature, and/or distortional twisting throughout a profile of a feature. In particular, in the parallel charging mechanism that is bottom dominated, the deflected ion trajectory may contribute to systematic and random twisting, oxide contact ellipticity, and/or asymmetric polymer deposition, which pushes adjacent features to merge and leads to "mousebite." dimple twisting, etc. Further, in the parallel charging mechanism that generally affects the top portion, the deflected ion trajectory may contribute to systemic twisting (e.g., short-loop SLIT twisting). Also, the time dependence of the charge may also change with mask consumption and type.

Mixed-Mode Multi-State Pulsing

Figure 4:
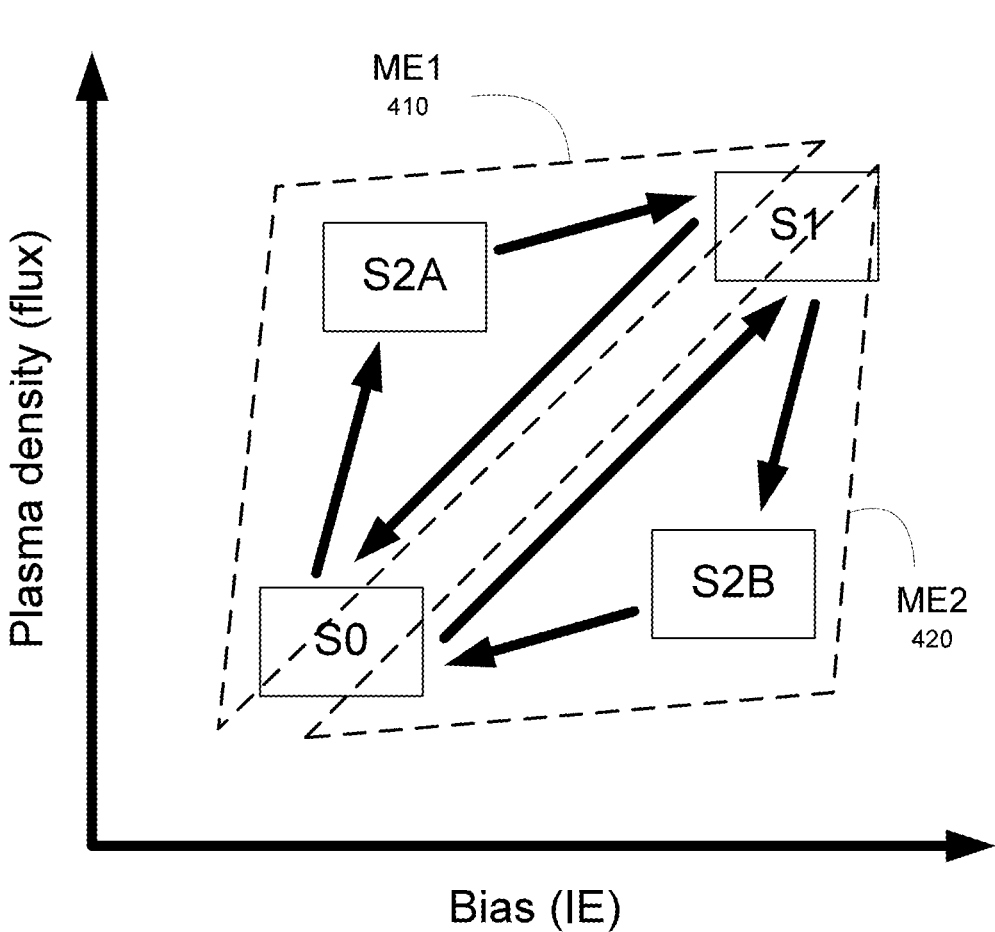
FIG. 4 is a diagram showing tailored multi-state RF pulsing using multiple cycling recipes, in accordance with one embodiment of the present disclosure.

FIG. 4 is a diagram 400 showing tailored mixed-mode, multi-state RF pulsing using multiple cycling recipes, in accordance with one embodiment of the present disclosure. Traditionally, pulsing is performed between two RF power states including a low power state (i.e., RF state [S0] configured with low RF power for a higher frequency signal from an RF source power supply that may be performed for passivating sidewalls of the feature) and a peak power state (i.e., RF state [S1] configured with low RF power for a lower frequency signal from an RF bias power supply that may be performed for ion bombardment of the feature) when performing etching of features in dielectric-containing material of a stack. In embodiments of the present disclosure, the mixed-mode, multi-state RF pulsing is performed over two etch cycles (also referred to as cycling stages), wherein each etch cycle includes multiple RF states including RF states S0 and S1, and one or more extension states (e.g., S2A and S2B).

In particular, etch cycle ME1 410 is one mode of the mixed-mode, multi-state RF pulsing technique used for etching. Etch cycle ME1 includes the RF states S0 and S1, and at least extension state S2A that is tuned to provide increased ion flux to the etching chemistry. Each of the RF states is pulsed repeatedly in etch cycle ME1 over one or more patterns, as will be further described in the following figures. In general, flux of ion species is related to (e.g., proportional, etc.) the plasma density. In particular, etch cycle ME1 includes a flux extension state S2A that is configured to provide a higher density plasma, and increased flux of ions at the higher frequency signal provided by the RF power supply (e.g., source power) used for generating the plasma. Also, ion flux may also be related to velocity of ions, and may be further described as the number of ions passing through an unit area over a unit period of time. For example, increasing the RF power for the higher frequency signal may increase the flux and/or plasma density. The flux extension state S2A provides for passivation of sidewalls of the feature, wherein the passivation is focused at the top of the feature. This provides for protection of the top portion of the feature from becoming over enlarged during the etching process (e.g., higher etch rates in RF state S1 may lead to defects in the feature), especially as etching is performed deeper and deeper into the feature to achieve high aspect ratios.

Further, etch cycle ME2 420 is another mode of the mixed-mode, multi-state RF pulsing technique used for etching. Etch cycle ME2 includes the RF states S0 and S1, and at least voltage extension state S2B that is tuned to provide additional ion bombardment of the feature. Each of the RF states is pulsed repeatedly in etch cycle ME1 over one or more patterns, as will be further described in the following figures. In particular, voltage extension state S2B provides for lower flux, but higher RF bias power that is configured to provide additional ion bombardment that is focused at the bottom of the feature, which may be beneficial when etching features with high aspect ratios. That is, the voltage extension state S2B provides for better directionality of ions to the bottom of the feature for ion bombardment. In particular, the power may be increased for the lower frequency signal supplied by an RF bias power supply (i.e., the RF bias power is increased) to implement the voltage extension state S2B.

FIG. 5 and FIGS. 6A-6C illustrate a mixed mode, multi-state RF pulsing method performed over two cycling stages or etching cycles, wherein each of the etch cycles can tune control parameters including etching chemistry, and RF power levels for a high frequency signal provided by an RF power supply (e.g., source RF power), and a low frequency signal provided by an RF bias power supply, pulsing frequency, pulsing periods, pulsing patterns, and others.

In particular. FIG. 5 is a flow diagram 500 illustrating a method for etching a feature in a stack including dielectric material such as when fabricating a 3D NAND structure on a substrate, wherein a mixed mode, multi-state pulsing technique is implemented for etching the feature, in accordance with one embodiment of the present disclosure. Diagram 400 of FIG. 4 illustrates the implementation of flow diagram 500. The method of flow diagram 500 may be stored in computer-readable form in memory accessible by control module 100 of FIG. 1 and/or control module 1300 of FIG. 13 in order to perform the operations of flow diagram 500.

Generally, the method of flow diagram 500 is performed on a substrate that may be provided to a plasma chamber. A stack of dielectric material is formed over the substrate, and a mask layer that is patterned overlays the stack of dielectric material. The mask layer is patterned, and includes openings through which etching of the stack occurs in order to form the high aspect ratio features. A plasma is generated from a plasma generating gas contained within the plasma chamber. The plasma generating gas also including an etching chemistry which may selectively tuned so that is appropriate for etching the materials in the stack in a corresponding etch cycle. For illustration purposes only, the etching chemistry may include, in part, one or more carbon-containing species, one or more fluorine-containing species, etc. For example materials that are commonly used in etch chemistry include, but are not limited to, fluorocarbons and hydrofluorocarbons, such as C3F8, C4F8, C4F6, CH2F2, CH3F, CHF3, F5F8, C6F6, etc.

At 510, the method includes continually rotating between a first etch cycle (i.e., cycling stage) and a second etch cycle (i.e., cycling stage) applied using a first etching chemistry for a period of time to etch a feature in a masked substrate. For example, the first etch cycle and the second etch cycle provide for the two modes in the mixed-mode, multi-state RF pulsing technique used for etching features in a stack of dielectric material. Each etch cycle includes multiple RF states including RF states S0, S1, and one or more extension states (e.g., S2A, S2B, etc.), as is shown in diagram 400 of FIG. 4.

At 520, the method includes performing the first etch cycle on the masked substrate using the first etching chemistry for a first sub-period. For example, the first etch cycle may be represented by ME1 410, as is shown in FIG. 4, and includes multiple RF power states S0, S1, and the extension state S2A applied under a first etching chemistry. Importantly, for each RF power state in etch cycle ME1, a power level is assigned to each of a high frequency RF signal generated by an RF power supply (e.g., source RF power supply) and a low frequency RF signal generated by an RF bias power supply, as previously described.

The first etch cycle is continually rotated between a first RF power state (S0) configured for passivation, a second RF power state (S2) which is the extension state, and a third RF power state (S1) configured for etching the masked substrate, as previously described. The first RF power state (S0) is a low power state that is configured for passivating the sidewalls of the feature being etched, and the third RF power state (S1) is a peak power state that is configured for ion bombardment of the feature being etched. Pulsing between the first RF power state (S0), second RF power state or extension state (S2A), and the third RF power state (S1) is performed for the first sub-period in the first etch cycle (e.g., ME1).

During the second state (S2A) of the first etch cycle (i.e., the extension state), the method includes performing a first tuning step by tuning the first etching chemistry, the high frequency RF power (e.g., for the high frequency signal generated by the source RF power supply) and a low frequency RF power (e.g., for the low frequency signal generated by the RF bias power supply) to provide extended passivation to the feature in the masked substrate. For example, the first etching chemistry is tuned by selecting the proper gas composition used during the first etch cycle. In addition, additional tuning of control parameters may include selection of the proper power level for the high frequency RF power, and selection of the proper power level for the low frequency RF power in each of the RF states within the first etch cycle. A power ratio between the power levels for the low frequency RF power and the high frequency RF power in the extension state (S2A), or vice versa, may be defined for the first each cycle.

At 530, the method includes performing the second etch cycle on the masked substrate using a second etching chemistry for a second sub-period. For example, the second etch cycle may be represented by ME2 420, as is shown in FIG. 4, and includes multiple RF power states S0, S1, and the extension state S2B. As previously introduced, for each RF power state in etch cycle ME2, a power level is assigned to each of a high frequency RF signal generated by an RF power supply (e.g., source RF power supply) and a low frequency RF signal generated by an RF bias power supply.

Generally, the power levels assigned to the high frequency RF signal generated by the RF power supply (e.g., source RF power supply) and the low frequency RF signal generated by an RF bias power supply for each of the RF power states S0 and S1 in etch cycles ME1 and ME2 are substantially equal. That is, the power levels assigned to the high frequency RF signal generated by the RF power supply for the first RF states (S0) performed in each of the etch cycles ME1 and ME2 are approximately equal. Also, the power levels assigned to the low frequency RF signal generated by the RF bias power supply for the first RF states (S0) performed in each of the etch cycles ME1 and ME2 are approximately equal. Also, the power levels assigned to the high frequency RF signal generated by the RF power supply for the third RF states (S1) performed in each of the etch cycles ME1 and ME2 are approximately equal. Further, the power levels assigned to the low frequency RF signal generated by the RF bias power supply for the third RF states (S1) performed in each of the etch cycles ME1 and ME2 are approximately equal.

However, the power levels assigned to the high frequency RF signal generated by the RF power supply and the power levels assigned to the low frequency RF signal generated by the RF bias power supply during the extension states (i.e., S2A and S2B) in etch cycles ME1 and ME2 may be different. That is, the power ratio between the power levels for the low frequency RF power and the high frequency RF power, or vice versa, for each of etch cycles ME1 and ME2 may be different.

The second etch cycle between the first RF power state (S0) configured for electrical discharge, a RF power fourth state (S2B) which is the extension state, and the third state (S1) configured for etching the feature in the masked substrate. As previously described, the first RF power state (S0) is a low power state that is configured for passivating the sidewalls of the feature being etched, and the third RF power state (S1) is a peak power state that is configured for ion bombardment of the feature being etched. Pulsing between the first RF power state (S0), fourth RF power state or extension state (S2B), and the third RF power state (S1) is performed for the second sub-period in the second etch cycle (e.g., ME2).

During the fourth state (S2B) of the second etch cycle (i.e., the extension state), a second tuning step is performed by tuning the second etching chemistry, the high frequency RF power (e.g., for the high frequency signal generated by the source RF power supply), and the low frequency RF power (e.g., for the low frequency signal generated by the RF bias power supply) to provide punch-through etching to the feature in the masked substrate. For example, the second etching chemistry is tuned by selecting the appropriate gas composition used during the second etch cycle. In addition, additional tuning of control parameters may include selection of the proper power level for the high frequency RF power, and selection of the proper power level for the low frequency RF power in each of the RF states within the second etch cycle. A power ratio between the power levels for the low frequency RF power and the high frequency RF power in the extension state (S2B), or vice versa, may be defined for the second etch cycle.

Further, after a period of time, the feature begins to form in the stack. After the feature reaches its final etch depth, the substrate may be removed from the plasma chamber.

Figure 6A:
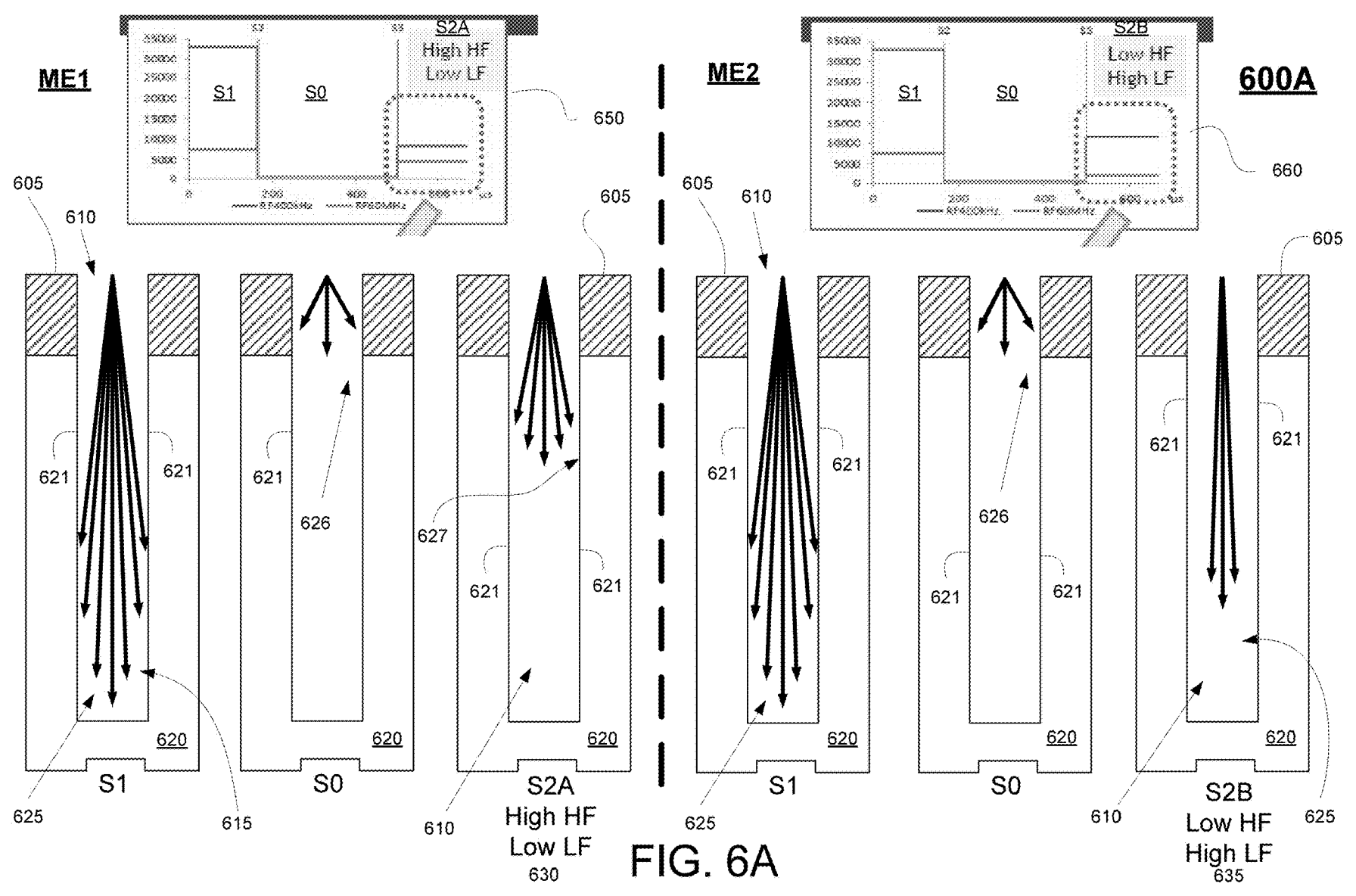

FIG. 6A is a diagram 600A illustrating two etch cycles and/or cycling stages (e.g., ME1 and ME2) having different cycling recipes each with three pulsed RF power states that is used in a mixed mode, multi-state pulsing process for etching a feature in a stack including dielectric material, such as when fabricating a 3D NAND structure on a substrate, in accordance with one embodiment of the present disclosure. The operations shown in FIG. 6A form one implementation of the mixed-mode, multi-state RF pulsing using multiple cycling recipes when performing etching of a feature in a stack of dielectric material formed over a masked substrate, in accordance with one embodiment of the present disclosure. For example, the operations shown in FIG. 6A may be one implementation of the method of flow diagram 500.

As shown, diagram 600A includes a first etch cycle (i.e., cycling stage) that is labeled ME1. The first etch cycle includes multiple RF power states S0 (e.g., low power state), S1 (peak power state), and the flux extension state S2A (630) that are applied using a first etching chemistry to perform etching of a feature 610. In general, the etching process is performed on a stack of dielectric material 620 (e.g., oxide-nitride-oxide layers, oxide layers, etc.) formed over a substrate (not shown), and a mask layer 605 that overlays the stack 620. A power diagram 650 showing power levels for each of a high frequency RF signal (e.g., 60 MHz in a particular case) and a low frequency RF bias signal (e.g., 400 kHz in a particular case) for each of the RF power states used in the first etch cycle ME1 is also shown in diagram 600A, and with more detail in FIG. 6B.

The RF power states S0, S1, and the flux extension state S2A (630) in the first etch cycle ME1 are continually rotated for a first sub-period. The order of the RF power states in the first etch cycle ME1 is selectable, and in one particular case, the RF power states are pulsed in an order with RF power state S0 following RF power state S1, and RF power flux extension state S2A following RF power state S0.

Control parameters for the peak power RF power state S1 are tuned in etch cycle ME1 to provide for ion bombardment of the feature 610. In general, the power levels for each of the high frequency RF signal and a low frequency RF bias signal are relatively high to perform etching using a first etching chemistry. That is, the power level for the high frequency RF signal is relatively high to provide for peak plasma density, and the power level for the low frequency RF bias signal is also relatively high to provide for peak ion bombardment. For instance, ions 615 are shown sweeping down the sidewalls 621 and bombarding the bottom portion 625 of the feature 610. Slight passivation on the sidewalls 621 may also occur. As such, RF power state S1 is used for etching the feature 620.

Control parameters for the low power RF power state S0 are tuned in etch cycle ME1 to provide for passivation of the feature 610. In general, the power levels for each of the high frequency RF signal and a low frequency RF bias signal are relatively low to perform passivation of the feature etching using a first etching chemistry. Because the power levels are relatively low, the passivation is performed mostly at the top portion 626 of the feature 610, as shown.

Control parameters for the RF power flux extension state S2A (630) are tuned in etch cycle ME1 to provide for additional passivation of the feature 610. That is, the power levels for each of the high frequency RF signal and a low frequency RF bias signal are tuned to provide for higher ion flux (i.e., higher RF power for the high frequency RF signal and lower RF bias power for the low frequency RF signal to provide for higher plasma density), which results in passivation of the sidewalls 621 of the feature 610. Specifically, the power levels for the high frequency RF signal and a low frequency RF bias signal are tuned to provide for deposition and/or passivation higher up on the sidewalls, such as around the upper-mid portion 627 of feature 610. In that manner, as more etching of the feature 610 is performed, the opening at the top does not become overly enlarged because of the passivation layer applied to the upper-mid and top portions of feature 610.

In addition, the etching chemistry for the etch cycle ME1 is tuned to provide for additional passivation of feature 610, such as when performing the RF power flux extension state S2A (630). Specifically, the etching chemistry may have higher levels of carbon-fluorine gas (i.e., fluorocarbon gas) and less hydrocarbon fluorine gas when compared to the etching chemistry used in etch cycle ME2. Correspondingly, the etching chemistry used in etch cycle ME2 may have lower carbon-fluorine gas, and higher levels of hydrocarbon fluorine gas, when compared to the gas composition of the etching chemistry used in etch cycle ME1.

As such, as the stack 620 is etched, a passivation layer forms on sidewalls 621 of the high aspect ratio feature 610 during etch cycle ME1. For example, the passivation layer is formed from the materials in the stack that are combined with one or more materials from the etching chemistry used in etch cycle ME1. Without additional processes, this passivation layer may have a non-uniform thickness, and may concentrated at the top portion 626 of the feature 610, thereby inhibiting the ability to etch deeper into the feature 610 and/or keeping the high aspect ratio of the feature 610 lower than desired. For example, the passivating layer may have a non-uniform thickness and/or composition, and may be concentrated near the top of the feature. In embodiments of the present disclosure, the first etch cycle ME1 is cycled and/or looped with a second etch cycle ME2 to provide for deeper and enhanced ion etching of the feature, as described below.

In particular, diagram 600A includes a second etch cycle (i.e., cycling stage) that is labeled ME2. The second etch cycle includes multiple RF power states S0 (e.g., low power state), S1 (peak power state), and the bias voltage extension state S2B (635) that are applied using a second etching chemistry. As previously introduced, the etching process is performed on a stack of dielectric material 620 (e.g., oxide-nitride-oxide layers, oxide layers, etc.) formed over a substrate (not shown), and a mask layer 605 that overlays the stack 620. A power diagram 660 showing power levels for each of a high frequency RF signal (e.g., 60 MHz in a particular case) and a low frequency RF bias signal (e.g., 400 kHz in a particular case) for each of the RF power states used in the second etch cycle ME2 is also shown in diagram 600A, and with more detail in FIG. 6B.

The RF power states S0, S1, and the flux extension state S2B (635) in the second etch cycle ME2 are continually rotated for a second sub-period. The order of the RF power states in the first etch cycle ME1 is selectable, and in one particular case, the RF power states are pulsed in an order with RF power state S0 following RF power state S1, and RF bias power extension state S2B following RF power state S0.

Control parameters for the peak power RF power state S1 are tuned in etch cycle ME1 to provide for ion bombardment of the feature 610, as previously described. In general, the power levels for each of the high frequency RF signal and a low frequency RF bias signal are relatively high to perform etching using the second etching chemistry. That is, the power levels for the high frequency RF signal and low frequency RF bias signal are approximately equal to the power levels used in the RF power state S1 in first etch cycle ME1 to provide for peak ion bombardment, such as the bottom portion 625 of feature 610. Slight passivation of the sidewalls 621 may also occur.

Also as previously described, control parameters for the low power RF power state S0 are tuned in etch cycle ME2 to provide for passivation of the feature 610. In general, the power levels for each of the high frequency RF signal and a low frequency RF bias signal are relatively low to perform passivation of the feature etching using a first etching chemistry. Because the power levels are relatively low, the passivation is performed mostly at the top portion 626 of the feature 610, as shown.

Control parameters for the RF power bias voltage extension state S2B (635) are tuned in etch cycle ME1 to provide for anisotropic bottom edge ion bombardment of the feature 610. That is, the power levels for each of the high frequency RF signal and a low frequency RF bias signal are tuned to provide for greater RF bias voltage (i.e., lower RF power for the high frequency RF signal and higher RF bias power for the low frequency RF signal), which results in additional anisotropic ion bombardment of the bottom edge or portion 625 of feature 610.

In particular, the etching chemistry for the etch cycle ME2 is tuned to provide for additional anisotropic ion bombardment of the bottom portion of feature 610, such as when performing the RF power bias voltage extension state S2B (635). Specifically, the etching chemistry used in etch cycle ME2 may have lower carbon-fluorine gas, and higher levels of hydrocarbon fluorine gas, when compared to the gas composition of the etching chemistry used in etch cycle ME1.

FIG. 6B is a diagram 600B illustrating RF power levels applied during an exemplary mixed mode, multi-state pulsing process for etching a feature in a stack including dielectric material such as when fabricating a 3D NAND structure on a substrate, in accordance with one embodiment of the present disclosure. Diagram 600B may be an illustration of the RF power levels applied when performing the etch cycles ME1 and ME2 of FIG. 6A, but also are illustrative of RF power levels applied when performing any of a number of mixed mode, multi-state pushing techniques used for etching. More particularly, the RF power levels include a high frequency RF signal 645 (shown as a solid line), which is generally used for controlling and/or generating a plasma, and in a particular case is generated at 60 MHZ. Also, the RF power levels include a low frequency RF bias signal 640 (shown as a dashed line), which is generally used for controlling ion bombardment of a feature, and in a particular case is generated at 400 KHz.

In various implementations, the following conditions may be applied to generate the plasma. The plasma may be generated using the high frequency RF signal 645 that is generated using an RF power source at a frequency between about 13-169 MHZ, for example between about 20-100 MHZ (e.g., 60 MHz in a particular case), and at a power level between 0 watts (W) to 15 kilowatts (KW), or between about 0 W to 10 KW, or between about 250 W to 10 kW, or between about 500 W to 10 KW. In one embodiment, a plasma is generated using the high frequency RF signal 645 at a frequency of 60 MHZ, at a power level between about 500 W and 10 kW.

In addition, a bias (e.g., RF bias power) may be applied to the substrate using a low frequency RF bias signal 640, for example to promote a high vertical etch rate. The RF bias power may be applied to the substrate at a frequency between about 20 kHz and 1.5 MHZ, or between about 200 kHz and 1.5 MHZ, or between about 300 kHz and 600 kHz (e.g., about 400 kHz in a particular case), and at a power level between about 0 watts (W) to 50 kilowatts (KW), between about 250 W to 45 KW, between about 500 W to 35 KW. In various cases, the power level of the RF bias power used to generate the plasma may be particularly high, for example about 5 KW or greater, or 6 kW or greater, or 10 KW or greater, or 20 KW or greater, or 30 KW or greater. In one embodiment, the substrate is biased at 400 kHz, at a power level between about 500 W and 35 kW.

As shown, power diagram 650 illustrates the RF power levels for the first etch cycle ME1, wherein the x-axis is time, and the y-axis is the power level (e.g., expressed in watts). As previously described, the RF power states (e.g., S0, S1, and flux extension state S2A) in etch cycle ME1 are continually rotated for a first sub-period of time. Each RF power state may last or be pulsed between tens to hundreds of milliseconds. For example, the pulsing period for RF power state S1 may be between 0 and 300 microseconds, the pulsing period for the RF power state S0 may be between 0 and 400 microseconds, and the period for RF power state S2A may be between 0 and 300 microseconds. The first sub-period of time may last between 400 to 800 microseconds.

Also, power diagram 660 illustrates the RF power levels for the second etch cycle ME2, wherein the x-axis is time, and the y-axis is the power level (e.g., expressed in watts). As previously described, the RF power states (e.g., S0, S1, and bias voltage extension state S2B) in etch cycle ME2 are continually rotated for a second sub-period of time. Each RF power state may be last between tens to hundreds of milliseconds. As shown, the pulsing period for RF power state S1 may be between 0 and 300 microseconds, the pulsing period for the RF power state S0 may be between 0 and 400 microseconds, and the period for RF power state S2A may be between 0 and 300 microseconds. The second sub-period of time may last between 400 to 800 microseconds.

As shown in power diagrams 650 and 660, the power levels for the low frequency RF power signal 640 and the high frequency RF power signal 645 are shown for each of the RF power states S0, S1, and the flux extension state S2A for ME1 and the bias voltage extension state S2B for me2. In general, the power levels for the low frequency RF power signal 640 and the high frequency RF power signal 645 in each of the RF peak power states S1 in etch cycles ME1 and ME2 are approximately equal, and configured to provide ion bombardment to the corresponding feature. For example, each of the low frequency RF power signal 640 and the high frequency RF power signal 645 are generated at peak power levels for all states in either etch cycles ME1 or ME2.

Also, the power levels for the low frequency RF power signal 640 and the high frequency RF power signal 645 in each of the RF low power states S0 in etch cycles ME1 and ME2 are approximately equal, and configured to provide passivation to the corresponding feature. For example, each of the low frequency RF power signal 640 and the high frequency RF power signal 645 are generated at their lowest power levels for all states in either etch cycles ME1 or ME2

Importantly, the power levels for each of the low frequency RF power signal 640 and the high frequency RF power signal 645 are tuned in each of the extension states S2A of etch cycle ME1 and S2B of etch cycle ME2 to achieve desired results. In particular, for etch cycle ME1, the power levels for the low frequency RF power signal 640 and the high frequency RF power signal 645 are tuned to achieve higher ion flux and/or greater plasma density in extension state S2A, as previously described. For example, the power level for the high frequency RF power signal 645 may be relatively high in flux extension state S2A, such as when compared to the power level for the high frequency RF power signal 645 applied in bias voltage extension state S2B of etch cycle ME2. Also, the power level for the low frequency RF power signal 640 may be relatively low in flux extension state S2A, such as when compared to the power level for the low frequency RF power signal 640 applied in bias voltage extensions state S2B of etch cycle ME2.

Correspondingly, for etch cycle ME2, the power levels for the low frequency RF power signal 640 and the high frequency RF power signal 645 are tuned to provide aniso-tropic ion bombardment in extension state S2B (635), espe-cially directed to the bottom edge and/or portion of the corresponding feature. For example, the power level for the high frequency RF power signal 645 may be relatively low in bias voltage extension state S2B of etch cycle ME2, such as when compared to the power level for the high frequency RF power signal 645 applied in flux extension state S2A of etch cycle ME1. Also, the power level for the low frequency RF power signal 640 may be relatively high in bias voltage extension state S2B of etch cycle ME2, such as when compared to the power level for the low frequency RF power signal 640 applied in flux extension state S2A of etch cycle ME1.

As shown and as previously described, the power levels assigned to the low frequency RF power signal 640 and the high frequency RF power signal 645 during the extension states S2A and S2B in etch cycles ME1 and ME2 may be different. The RF power levels for a corresponding etch cycle may be illustrated by a power ratio defining a rela-tionship between the RF power of the low frequency RF power signal 640 and the RF power of the high frequency RF power signal 645 (e.g., [RF power of the low frequency RF power signal 640]/[RF power of the high frequency RF power signal 645]). In one embodiment, the power ratio for etch cycle ME2 is higher than the power ratio for etch cycle ME1 in corresponding extension states. That is, the power ratio between the low frequency RF power signal 640 and the RF power of the high frequency RF power signal 645 in the extension state S2B (635) for etch cycle ME2 is greater than the power ratio between the low frequency RF power signal 640 and the RF power of the high frequency RF power signal 645 in flux extension state S2A (630) for etch cycle ME1. In other words, the power ratio is increased between the first etch cycle ME1 and the second etch cycle ME2, wherein the power ratio in the first etch cycle ME1 is less than the power ratio of the second etch cycle ME2.

In addition, even though the power ratios between the low frequency RF power signal 640 and the RF power of the high frequency RF power signal 645 for the extension cycles in etch cycles ME1 and ME2 are different, the total power levels applied in the extension states of etch cycles ME1 and ME2 are approximately equal, in one embodiment. That is, the total power levels for the low frequency RF power signal 640 and the RF power of the high frequency RF power signal 645 as applied in flux extension state S2A (630) of etch cycle ME1 (e.g., summed power levels) is approxi-mately equal to the total power levels for the low frequency RF power signal 640 and the RF power of the high fre-quency RF power signal 645 as applied in bias voltage extension state S2B (635) of etch cycle ME2 (e.g., summed power levels).

Figure 6C:
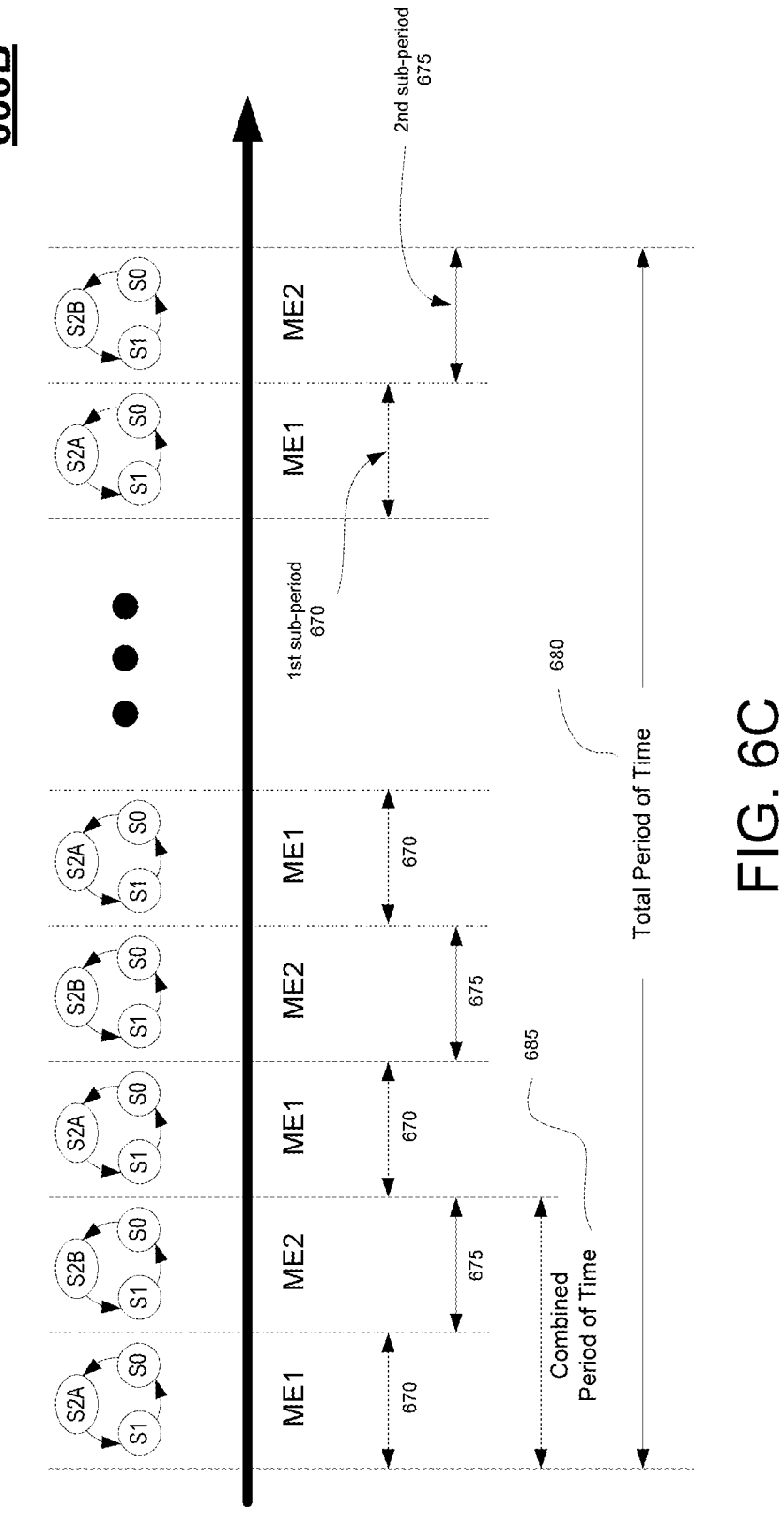
FIG. 6C is a diagram illustrating pulsing of RF states during two cycling stages having different cycling recipes used in a mixed mode, multi-state pulsing process of FIG. 6A for etching a feature in a stack including dielectric material such as when fabricating a 3D NAND structure on a substrate, in accordance with one embodiment of the present disclosure.

FIG. 6C is a diagram 600C illustrating pulsing of RF states during two etch cycles (e.g., cycling stages) having different cycling recipes, for example as used in a mixed mode, multi-state pulsing process of FIG. 6A, for etching a feature in a stack including dielectric material such as when fabricating a 3D NAND structure on a substrate, in accor-dance with one embodiment of the present disclosure. As shown, etch cycle ME1 includes RF low power state S0. RF peak power state S1, and flux extension state S2A. Also, etch cycle ME2 includes RF low power state S0. RF peak power state S1, and bias voltage extension state S2B. Although the RF power states are shown to be performed in a particular order (e.g., S0 then S2A then S1 and then back to S0 and so on in ME1: and S0 then S2B then S21 and then back to S0 and so on in ME2), the RF power states may be cycled in other orders or patterns (e.g., S0 then S1 then S2A and then back to S0 and so on in ME1: and S0 then S1 then S2B and then back to S0 and so on in ME2).

As previously described, the RF power states (e.g., S0, S1, and flux extension state S2A) in etch cycle ME1 are continually rotated and/or pulsed for a first sub-period of time 670. Also, the RF power states (e.g., S0, S1, and bias voltage extension state S2B) are continually rotated and/or pulsed for a second sub-period of time 675. A combined period of time 685 includes both sub-periods 670 and 675 for the etch cycles ME1 and ME2.

As shown, the etch cycles ME1 and ME2 are continually looped for a total period of time 680. In effect, the extension states S2A and S2B are cycled between the etch cycles ME1 and ME2, given that the remaining RF power states (e.g., S0 and S1) are performed similarly within each of the etch cycles ME1 and ME2.

Figure 7A:
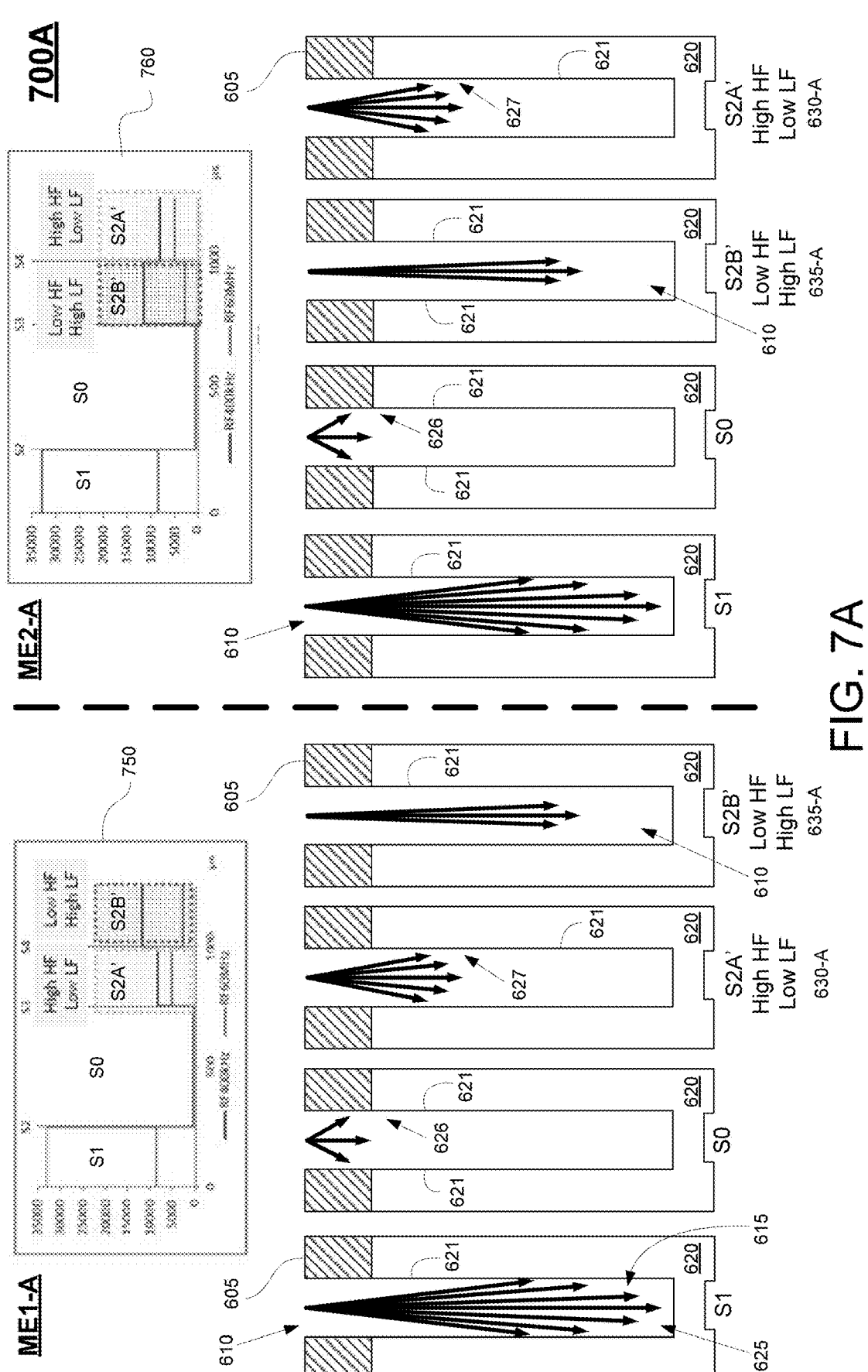
FIG. 7A is a diagram illustrating two cycling stages having different cycling recipes each with four pulsed RF power states that is used in a mixed mode, multi-state pulsing process for etching a feature in a stack including dielectric material such as when fabricating a 3D NAND structure on a substrate, and including two extension states in each of the cycling stages, in accordance with one embodiment of the present disclosure.

FIG. 7A is a diagram illustrating two etch cycles (i.e., cycling stages) having different cycling recipes each with four pulsed RF power states that is used in a mixed mode, multi-state pulsing process for etching a feature in a stack including dielectric material such as when fabricating a 3D NAND structure on a substrate, and including two extension states in each of the cycling stages, in accordance with one embodiment of the present disclosure.

The operations shown in FIG. 7A form one implementa-tion of the mixed-mode, multi-state RF pulsing using mul-tiple cycling recipes when performing etching of a feature in a stack of dielectric material formed over a masked sub-strate, in accordance with one embodiment of the present disclosure. For example, the operations shown in FIG. 7A may be one implementation of the method of flow diagram 500, with modifications, in one embodiment. In particular, two or more extension RF power states may be applied to the stack of dielectric when etching a corresponding feature. Different patterns and/or configurations of RF power states may be implemented when performing etching, as will be further described in relation to FIG. 9.

As shown, diagram 700A includes a first etch cycle (i.e., cycling stage) that is labeled ME1-A. The first etch cycle includes multiple RF power states S0 (e.g., low power state). S1 (peak power state), and at least two extension states, such as a flux extension state S2A' (630-A) and a bias voltage extension state S2B' (635-A), that are applied using a first etching chemistry to perform etching of a feature 610. In general, the etching process is performed on a stack of dielectric material 620 (e.g., oxide-nitride-oxide layers, oxide layers, etc.) formed over a substrate (not shown), and a mask layer 605 that overlays the stack 620. A power diagram 750 showing power levels for each of a high frequency RF signal (e.g., 60 MHz in a particular case) and a low frequency RF bias signal (e.g., 400 kHz in a particular case) for each of the RF power states used in the first etch cycle ME1-A is also shown in diagram 700A, and with more detail in FIG. 7B.

The RF power states S0, S1, the flux extension state S2A' (630-A), and the RF bias power extension state S2B' (635-A) in the first etch cycle ME1-A are continually rotated for a first sub-period. The order of the RF power states in the first etch cycle ME1-A is selectable, and in one particular case, the RF power states are pulsed in an order with RF power state S0 following RF power state S1, RF power flux extension state S2A' (630-A) following RF power state S0, and RF bias power extension state S2B' (635-A) following the RF power flux extension state S2A' (630-A).

Control parameters for the peak power RF power state S1 are tuned in etch cycle ME1 to provide for ion bombardment of the feature 610, as previously described in relation to FIG. 6A. In particular, the power levels for the high frequency RF signal and the low frequency RF signal are relatively high to provide for peak plasma density and for peak ion bombardment, respectively. For instance, ions 615 are shown sweeping down the sidewalls 621 and bombarding the bottom portion 625 of the feature 610 to perform etching of the feature. Slight passivation on the sidewalls 621 may also occur.

Control parameters for the low power RF power state S0 are tuned in etch cycle ME1 to provide for passivation of the feature 610, as previously described. In general, the power levels for each of the high frequency RF signal and a low frequency RF bias signal are relatively low to perform passivation of the feature etching using a first etching chemistry. Because the power levels are relatively low, the passivation is performed mostly at the top portion 626 of the feature 610, as shown.

Further, control parameters for the RF power flux extension state S2A' (630)-A) are tuned in etch cycle ME1-A to provide for additional passivation of the feature 610. In general, the RF power flux extension state S2A' (630-A) performs similarly as the RF power flux extension state S2A (630) of FIGS. 6A-6B. For example, the power level for the high frequency RF signal is tuned for higher ion flux, and the low frequency RF bias signal is tuned to provide for higher plasma density, which results in passivation of the sidewalls of feature (e.g., directed to the upper-mid portion 627 of feature 610. In that manner, as more etching of the feature 610 is performed, the opening at the top does not become overly enlarged because the passivation layer applied to the upper-mid and top portions of feature 610 protects that area from over-etching.

Also, control parameters for the RF power bias voltage extension state S2B' (635-A) are tuned in etch cycle ME1-A to provide for anisotropic bottom edge ion bombardment of the feature 610 using the first etching chemistry. In general, the RF bias power extension state S2B" (635-A) performs similarly as the RF bias power extension state S2B (635) of FIGS. 6A-6B. That is, the power levels for each of the high frequency RF signal and a low frequency RF bias signal are tuned to provide for greater RF bias voltage (i.e., lower RF power for the high frequency RF signal and higher RF bias power for the low frequency RF signal), which results in additional anisotropic ion bombardment (e.g., punch through etching) of the bottom edge or portion 625 of feature 610.

As shown in the first etch cycle ME1-A, both extension states (e.g., S2A' [630-A] and S2B' [635-A]) are performed so as to provide additional passivation to the mid to upper portions 627 of the feature 610 as well as anisotropic ion bombardment of the bottom edge or bottom portion 625 of the feature 610 while using the etching chemistry for the etch cycle ME1-A. In one embodiment, the etching chemistry may have higher levels of carbon-fluorine gas (i.e., fluorocarbon gas) and less hydrocarbon fluorine gas when compared to the etching chemistry used in etch cycle ME2-A. Correspondingly, the etching chemistry used in etch cycle ME2-A may have lower carbon-fluorine gas, and higher levels of hydrocarbon fluorine gas, when compared to the gas composition of the etching chemistry used in etch cycle ME1-A.

Further, diagram 700A includes a second etch cycle (i.e., cycling stage) that is labeled ME2-A. The second etch cycle includes multiple RF power states S0 (e.g., low power state), S1 (peak power state), and at least two extension states, such as a flux extension state S2A (630-A) and a bias voltage extension state S2B' (635-A), that are applied using a second etching chemistry to perform etching of a feature 610 in a stack of dielectric material 620 (e.g., oxide-nitride-oxide layers, oxide layers, etc.) formed over a substrate (not shown), and a mask layer 605 that overlays the stack 620. A power diagram 760 showing power levels for each of a high frequency RF signal (e.g., 60 MHz in a particular case) and a low frequency RF bias signal (e.g., 400 kHz in a particular case) for each of the RF power states used in the second etch cycle ME2-A is also shown in diagram 700A, and with more detail in FIG. 7B.

The RF power states S0, S1, the flux extension state S2A' (630-A), and the RF bias power extension state S2B' (635-A) in the second etch cycle ME2-A are continually rotated for a second sub-period using a second etching chemistry. The order of the RF power states in the second etch cycle ME2-A is selectable, and in one particular case, the RF power states are pulsed in an order with RF power state S0 following RF power state S1. RF bias power extension state S2B' (635-A) following RF power state S0, and RF power flux extension state S2A' (630-A) following RF bias power extension state S2B' (635-A). More particularly, the configuration of the extension states S2A (630-A) and S2B' (635-A) in etch cycle ME1-A is different than the configuration of the extension states S2A' (630-A) and S2B (635-A) in etch cycle ME2-A. In particular, the order of RF power extension states in the second etch cycle ME2-A (S2A' then S2B") is performed in reverse than the order of RF power extension states in the first etch cycle ME1-A (S2B" then S2A').

Control parameters for the peak power RF power state S1 and for the low power RF power state S0 are tuned in etch cycle ME2-A similarly as when tuned in etch cycle ME1-A. For example, power levels for each of the high frequency RF signal and a low frequency RF bias signal are relatively high to perform etching using the second etching chemistry in the peak power RF power state S1. Also, power levels for each of the high frequency RF signal and a low frequency RF bias signal are relatively low to perform passivation of the feature etching using the second etching chemistry.

FIG. 7B is a diagram illustrating power levels applied during a mixed mode, multi-state pulsing process of FIG. 7A for etching a feature in a stack including dielectric material such as when fabricating a 3D NAND structure on a substrate, in accordance with one embodiment of the present disclosure. Diagram 700B may be an illustration of the RF power levels applied when performing the etch cycles ME1-A and ME2-A of FIG. 7A, but also are illustrative of RF power levels applied when performing any of a number of mixed mode, multi-state pushing techniques used for etching. More particularly, the RF power levels include a high frequency RF signal 645 (shown as a solid line), which is generally used for controlling and/or generating a plasma, and in a particular case is generated at 60 MHZ. Also, the RF power levels include a low frequency RF bias signal 640 (shown as a dashed line), which is generally used for controlling ion bombardment of a feature, and in a particular case is generated at 400 KHZ.

As previously described, various conditions may be applied to generate the plasma, including using the high frequency RF signal 645 at a frequency between about 13-169 MHZ, for example between about 20-100 MHZ (e.g., 60 MHz in a particular case), and at a power level between about 0 watts (W) to 15 kilowatts (KW), or between about 0 W to 10 KW, or between about 250 W to 10 KW, or between about 500 W to 10 KW. Also, a bias (e.g., RF bias power) may be applied to the substrate using the low frequency RF bias signal 640, for example to promote a high vertical etch rate. The RF bias power may be applied to the substrate at a frequency between about 20 kHz and 1.5 MHZ, or between about 200 kHz and 1.5 MHZ, or between about 300 kHz and 600 kHz (e.g., about 400 kHz in a particular case), and at a power level between about 0 watts (W) to 50 kilowatts (KW), between about 250 W to 45 KW, between about 500 W to 35 kW.

As shown, power diagram 750 illustrates the RF power levels for the first etch cycle ME1-A, wherein the x-axis is time, and the y-axis is the power level (e.g., expressed in watts). As previously described, the RF power states (e.g., S0, S1, flux extension state S2A', and bias voltage extension state S2B') in etch cycle ME1-A are continually rotated for a first sub-period of time. Each RF power state may last between tens to hundreds of milliseconds. For example, the pulsing period for RF power state S1 may be between 0 and 300 microseconds, the pulsing period for the RF power state S0 may be between 0 and 500 microseconds, the period for RF power state S2A' (630-A) may be between 0 and 300 microseconds, and the period for RF power state S2B' (635-A) may be between 0 and 300 microseconds. The first sub-period of time may last between 500 to greater than 1500 microseconds.

Also, power diagram 750 illustrates the RF power levels for the second etch cycle ME2-A, wherein the x-axis is time, and the y-axis is the power level (e.g., expressed in watts). As previously described, the RF power states (e.g., S0, S1, flux extension state S2A', and bias voltage extension state S2B') in etch cycle ME2-A are continually rotated for a second sub-period of time. The pulsing periods for the RF power states in the second etch cycle ME2-A are similar to the pulsing periods for the RF power states in the first etch cycle ME1-A, as referenced above.

As shown in power diagrams 750 and 760, the power levels for the low frequency RF power signal 640 and the high frequency RF power signal 645 are shown for each of the RF power states S0, S1, the flux extension state S2A' (630-A), and RF bias power extension state S2B' (635-B) for etch cycles ME1-A and ME2-A. In general, the power levels for the low frequency RF power signal 640 and the high frequency RF power signal 645 in each of the RF peak power states S1 in etch cycles ME1-A and ME2-A are approximately equal, and configured to provide ion bombardment to the corresponding feature, as previously described. Also, the power levels for the low frequency RF power signal 640 and the high frequency RF power signal 645 in each of the RF low power states S0 in etch cycles ME1 and ME2 are approximately equal, and configured to provide passivation to the corresponding feature, as previously described.

Further, the power levels for each of the low frequency RF power signal 640 and the high frequency RF power signal 645 are tuned in each of the extension states S2A' (630-A) and S2B (635-A) of etch cycles ME1-A ME2-A to achieve desired results. In particular, within each of the etch cycles ME1-A and ME2-A, the power levels for the low frequency RF power signal 640 and the high frequency RF power signal 645 are similarly tuned to achieve higher ion flux and/or greater plasma density in flux extension state S2A (630-A). Also within each of the etch cycles ME1-A and ME2-A, the power levels for the low frequency RF power signal 640 and the high frequency RF power signal 645 are similarly tuned to provide anisotropic ion bombardment, especially directed to the bottom edge and/or portion of the corresponding feature in bias voltage extension state S2B (635-A).

Power levels assigned to the low frequency RF power signal 640 and the high frequency RF power signal 645 for the flux extension state S2A' (630-A) may be similar in etch cycles ME1-A and ME2-A. Also, power levels assigned to the low frequency RF power signal 640) and the high frequency RF power signal 645 for the RF bias voltage extension state S2B" (635-A) may be similar in etch cycles ME1-A and ME2-A. However, the power levels assigned to the low frequency RF power signal 640 and the high frequency RF power signal 645 during the extension states S2A (630-A) and S2B" (635-A) within etch cycle ME1-A or ME2-A may be different. As previously described, the power ratio between the low frequency RF power signal 640 and the RF power of the high frequency RF power signal 645 for the bias voltage extension state S2B' (635-A) is greater than the power ratio between the low frequency RF power signal 640 and the RF power of the high frequency RF power signal 645 for the flux extension state S2A (630-A) in each of the etch cycles ME1-A and ME2-A.

Further, the total power levels for the low frequency RF power signal 640 and the RF power of the high frequency RF power signal 645 as applied in the flux extension state S2A' (630-A) is approximately equal to the total power levels for the low frequency RF power signal 640) and the RF power of the high frequency RF power signal 645 as applied in the bias voltage extension state S2B' (635-A), in each of the etch cycles ME1-A and ME2-A, in one embodiment.

Figure 8A:
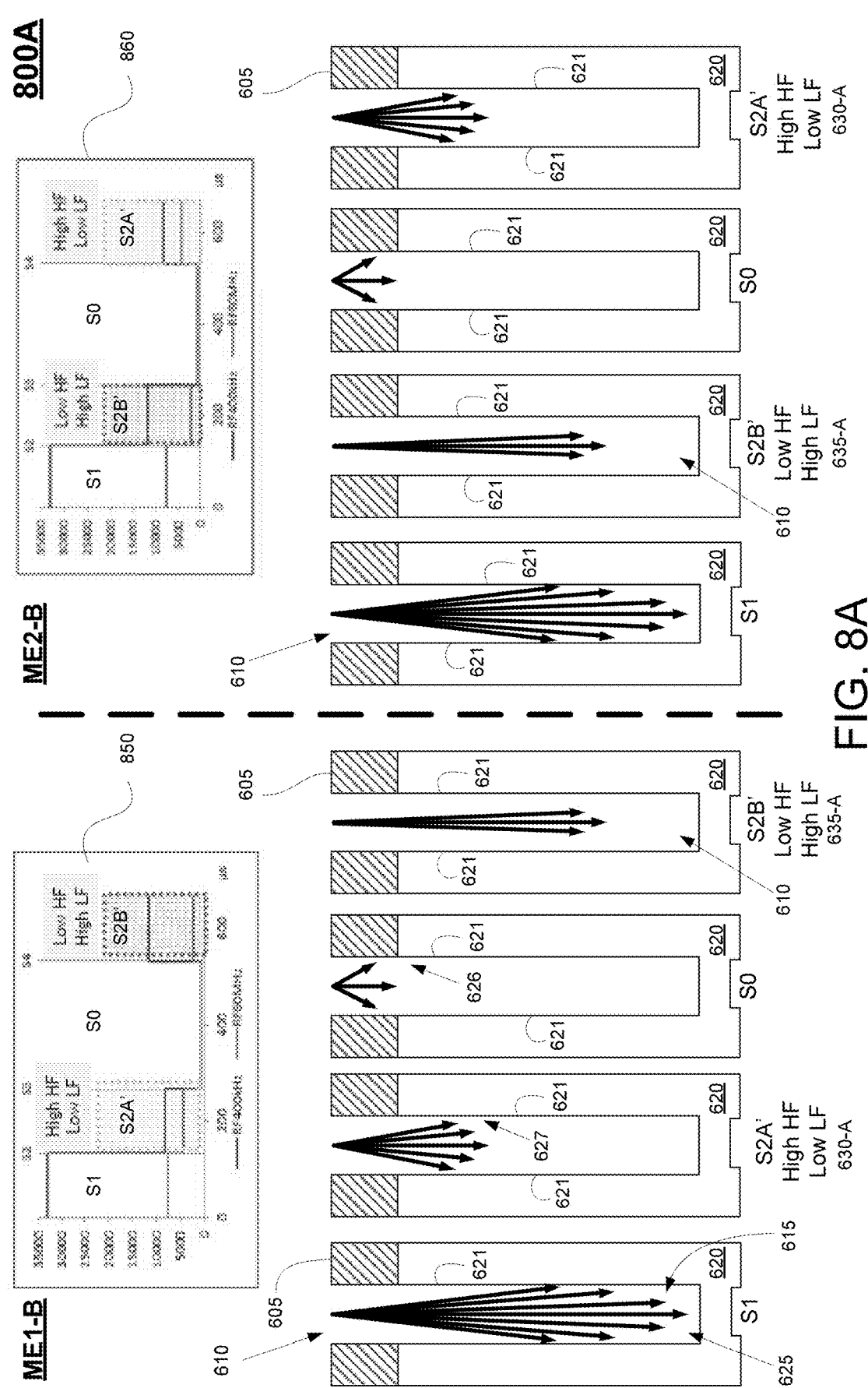
FIG. 8A is a another diagram illustrating two cycling stages having different cycling recipes each with four pulsed RF power states that is used in a mixed mode, multi-state pulsing process for etching a feature in a stack including dielectric material such as when fabricating a 3D NAND structure on a substrate, wherein in each cycling stage two extension states straddle a low RF power state, in accordance with one embodiment of the present disclosure.

FIGS. 8A and 8B illustrate another implementation of the mixed-mode, multi-state RF pulsing using multiple cycling recipes when performing etching of a feature in a stack of dielectric material formed over a masked substrate, in accordance with one embodiment of the present disclosure. For example, the operations shown in FIG. 7A may be one implementation of the method of flow diagram 500, with modifications, in one embodiment. In particular, two or more extension RF power states may be applied to the stack of dielectric when etching a corresponding feature. Different patterns and/or configurations of RF power states may be implemented when performing etching, as will be further described in relation to FIG. 9.

In particular. FIG. 8A is a another diagram 800A illustrating two etch cycles (i.e., cycling stages) having different cycling recipes each with four pulsed RF power states that is used in a mixed mode, multi-state pulsing process for etching a feature in a stack including dielectric material, wherein in each etch cycle includes two extension states that straddle a low power RF power state (i.e., RF power state S0), in accordance with one embodiment of the present disclosure.

As shown, diagram 800A includes a first etch cycle that is labeled ME1-B and a second etch cycle that is labeled ME2-B. Similar to the RF power states in diagram 700A, the first and second etch cycles ME1-B and ME2-B includes multiple RF power states S0 (e.g., low power state). S1 (peak power state), and at least two extension states, such as a flux extension state S2A' (630)-A) and a bias voltage extension state S2B' (635-A). The RF power states are applied using a first etching chemistry in etch cycle ME1-B, and are applied using a second etching chemistry in etch cycle ME2-B. Also, the RF power states S0, S1, the flux extension state S2A (630-A), and the RF bias power extension state S2B' (635-A) in the first etch cycle ME1-B are continually rotated for a first sub-period. In addition, the RF power states S0, S1, the flux extension state S2A (630-A), and the RF bias power extension state S2B" (635-A) in the second etch cycle ME2-B are continually rotated for a second sub-period.

The control parameters for each of the RF power states S0 (e.g., low power state). S1 (peak power state), and at least two extension states, such as a flux extension state S2A (630-A) and a bias voltage extension state S2B' (635-A) are similarly configured as the corresponding RF power states in FIG. 7A, including similarly configured power levels for the high frequency RF signal and the low frequency RF signal. Also, the power ratios defined between the power level of the low frequency RF power signal and the power level of the high frequency RF power signal for each of the extension states (flux extension state S2A' [630-A] and a bias voltage extension state S2B [635-A]) are similarly configured.

However, the order of performing the RF power states in diagram 800A for each of etch cycles ME1-B and ME2-B is different than the order of performing RF power stages in diagram 700A, as previously introduced. For example, each etch cycle ME1-B and ME2-B includes two extension states that straddle a low power RF power state (i.e., RF power state S0). In particular, the order of the RF power states in the first etch cycle ME2-A is selectable, and in one particular case, the RF power states are pulsed in an order with RF power flux extension state S2A (630-A) following RF power state S1, and RF power state S0 following RF power flux extension state S2A' (630-A). RF bias power extension state S2B" (635-A) following RF power state S0.

The configuration of the extension states S2A (630-A) and S2B' (635-A) in etch cycle ME1-B is different than the configuration of the extension states S2A' (630-A) and S2B (635-A) in etch cycle ME2-B. In particular, the order of RF power extension states in the second etch cycle ME2-B when straddling RF power state S0 is performed in reverse than the order of RF power extension states in the first etch cycle ME1-B. In particular, the order of the RF power states in the second etch cycle ME2-B is selectable, and in one particular case, the RF power states are pulsed in an order with RF bias power extension state S2B (635-A) following RF power state S1. RF power state S0 following RF bias power extension state S2B (635-A), and RF power flux extension state S2A (630-A) following RF power state S0.

FIG. 8B is a diagram 800B illustrating power levels applied during a mixed mode, multi-state pulsing process of FIG. 8A for etching a feature in a stack including dielectric material such as when fabricating a 3D NAND structure on a substrate, in accordance with one embodiment of the present disclosure. More particularly, the RF power levels include a high frequency RF signal 645 (shown as a solid line), which is generally used for controlling and/or generating a plasma, and in a particular case is generated at 60 MHZ. Also, the RF power levels include a low frequency RF bias signal 640 (shown as a dashed line), which is generally used for controlling ion bombardment of a feature, and in a particular case is generated at 400 KHz. Diagram 800B may be an illustration of RF power levels applied when performing the etch cycles ME1-B and ME2-B of FIG. 8A, but also are illustrative of RF power levels applied when performing any of a number of mixed mode, multi-state pushing techniques used for etching.

In particular, the RF power level conditions shown in FIG. 8B are similar to the RF power level conditions shown in FIG. 7B, except for the order of performing the RF power states in each of the etch cycles ME1-A and ME2-A in FIG. 7B and the order of performing the RF power states in each of the etch cycles ME1-B and ME2-B in FIG. 8B. As such, the discussion of RF power level conditions described in FIG. 7B applies similarly to the RF power level conditions shown in FIG. 8B and may be used for reference.

FIG. 9 is a table 900 illustrating various combinations of cycling recipes using in two etch cycles having different cycling recipes each with four pulsed RF power states that are used in a mixed mode, multi-state pulsing process for etching a feature in a stack including dielectric material such as when fabricating a 3D NAND structure on a substrate, in accordance with one embodiment of the present disclosure. For example, the combinations and configurations of RF power states shown in FIGS. 7A-7B and FIGS. 8A-8B are included in table 900.

Each of the first etch cycle ME1' and the second etch cycle ME2' includes four RF power states S0 (e.g., low power state), S1 (peak power state), and at least two extension states, such as a flux extension state S2A' (630-A) and a bias voltage extension state S2B' (635-A). Each of the extension states S2A' (630-A) and S2B' (635-A) have been previously introduced. Various orders of performing the four RF power states in each of the etch cycles ME1' and ME2' are shown in the sequences 1-10. The list provided in table 900 is not intended to be exhaustive, and there may be other combinations of RF power states in each of the etch cycles ME1' and ME2' that are not shown.

Multi-State RF Pulsing with One or Two Plasma Off States

FIGS. 10, 11A-11B, and 12A-12B describe methods for etching high aspect ratio features into dielectric containing material when fabricating semiconductor device, wherein the etching process is performed using multi-state RF pulsing techniques with one or two plasma off-states for in-feature second electron generation and/or charge neutralization to reduce in-feature charging induced defects, such as those formed when performing etching of 3D NAND memory slit etching.

Figure 10:
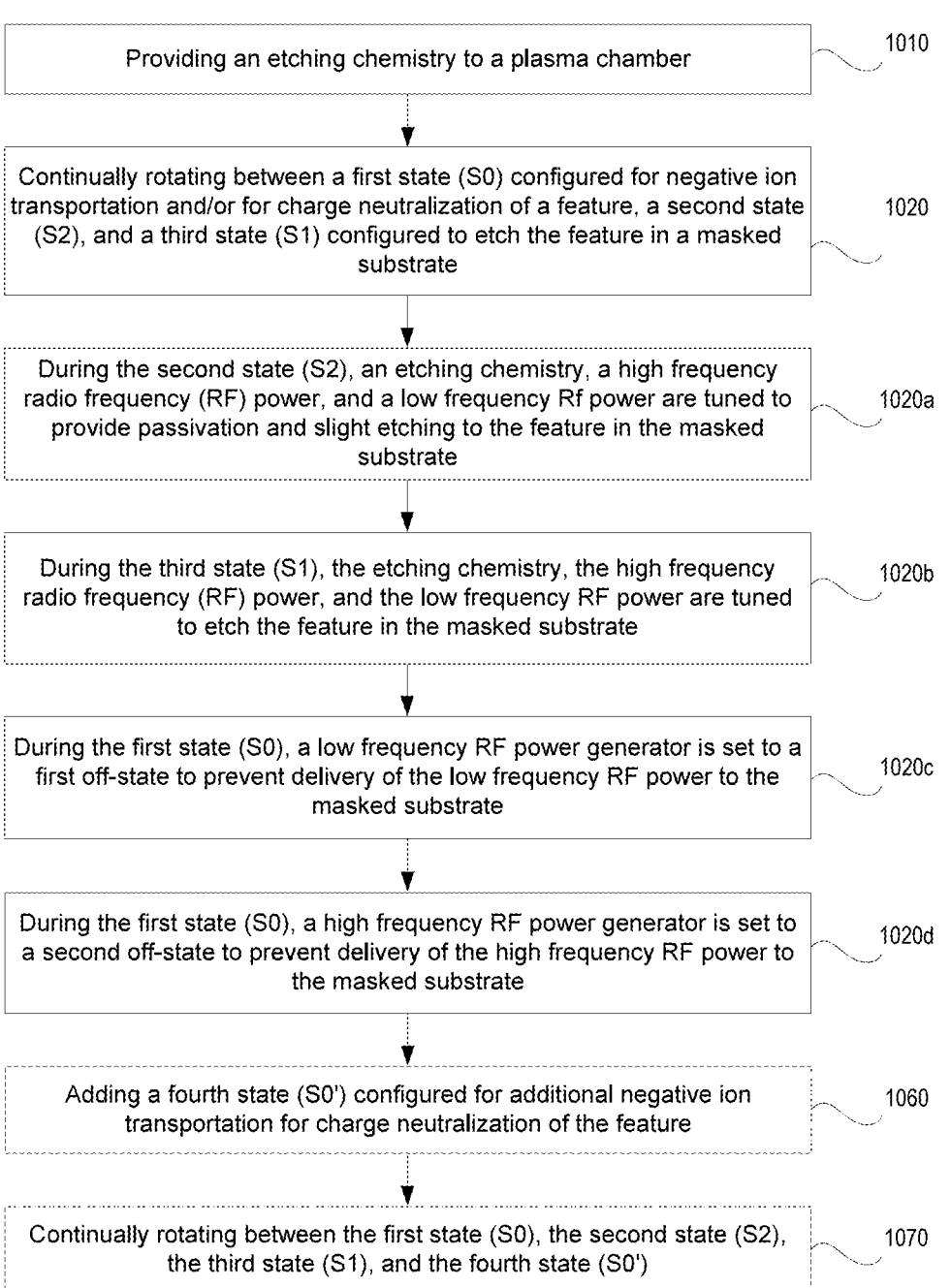
FIG. 10 is a flow diagram illustrating a method for etching a feature in a stack including dielectric material such as when fabricating a 3D NAND structure on a substrate, including multi state pulsing with one or two plasma off states, in accordance with one embodiment of the present disclosure.

In particular, FIG. 10 is a flow diagram 1000 illustrating a method for etching a feature in a stack including dielectric material such as when fabricating a 3D NAND structure on a substrate, including multi state pulsing with one or two plasma off states, in accordance with one embodiment of the present disclosure. The method of flow diagram 1000 may be stored in computer-readable form in memory accessible by control module 100 of FIG. 1 and/or control module 1300 of FIG. 13 in order to perform the operations of flow diagram 1000.

Generally, the method of flow diagram 1000 is performed on a substrate that may be provided to a plasma chamber. A stack of dielectric material is formed over the substrate, and a mask layer that is patterned overlays the stack of dielectric material. The mask layer is patterned, and includes openings through which etching of the stack occurs in order to form the high aspect ratio features. A plasma is generated from a plasma generating gas contained within the plasma chamber for purposes of performing etching of the feature in the stack of dielectric material formed over a substrate and overlaid with the mask layer. After a period of time, the feature begins to form in the stack. After the feature reaches its final etch depth, the substrate may be removed from the plasma chamber. The operations performed during etching are more fully described below.

In particular, at 1010 the method includes providing an etching chemistry to a plasma chamber. The plasma generating gas also including an etching chemistry which may selectively tuned so that is appropriate for etching the materials in the stack in a corresponding etch cycle. For illustration purposes only, the etching chemistry may include, in part, one or more carbon-containing species, one or more fluorine-containing species, etc. For example materials that are commonly used in etch chemistry include, but are not limited to, fluorocarbons and hydrofluorocarbons, such as C3F8, C4F8, C4F6, CH2F2, CH3F, CHF3, F5F8, C6F6, etc.

At 1020, the method includes continually rotating multiple RF power states under the etching chemistry. In particular, rotation is performed between a first RF power state (S0) configured for negative ion transportation for charge neutralization of a feature, a second RF power state (S2), and a third RF power state (S1) configured to etch the feature in a masked substrate including a stack of a plurality of dielectric layers and a mask layer that is patterned on top of the stack. Control parameters for each of the RF power states includes tuning RF power levels to each of a high frequency RF signal generated by a high frequency RF power generator (e.g., source RF power supply) and a low frequency RF signal generated by a low frequency RF power generator (e.g., RF bias power supply).

At 1020*a*, during the second RF power state (S2), the etching chemistry, the high frequency radio frequency (RF) power, and the low frequency RF bias power are tuned to provide passivation to the feature in the masked substrate. In particular, the power levels of the high frequency RF signal and the low frequency RF bias signal are tuned to provide passivation to the feature. The second RF power state (S2) performs the primary passivation of the feature, in embodiments. In one embodiment, the second RF power state (S2) performs the only passivation of the feature. This is because, in the off state (S0), the plasma sheath collapses (i.e., RF power generators are set to off states) thereby allowing for secondary electrons to flow down into the feature and neutralize any accumulated charge (i.e., provide for electrical discharge). Additionally, slight etching may be performed during the second RF power state (S2) based on the tuned power levels of the high frequency RF signal and the low frequency RF bias signal.

At 1020*b*, during the third state (S1), the etching chemistry of the etching conditions, the high frequency RF power, and the low frequency RF power are tuned to etch the feature in the masked substrate. In particular, the power levels for each of the high frequency RF power (generating the high frequency RF signal) and the low frequency RF power (generating the low frequency RF bias signal) are set relatively high (i.e., when compared to power levels in each of the other RF power states) to perform etching of the feature using the etching chemistry.

At 1020*c*, during the first state (S0), the low frequency RF power generator is set to a first off-state to prevent delivery of the low frequency RF power to the masked substrate. Also, at 1020*d*, during the first state (S0), a high frequency RF power generator is set to a second off-state to prevent delivery of the high frequency RF power to the masked substrate. As such, because no low frequency RF power and no high frequency RF power are delivered to the plasma chamber, the plasma sheath effectively collapses (e.g., completely or partially). Further, the pulsing periods of each of the RF power states are configured such that the plasma sheath does not need to be restricken and/or reignited during the (e.g., the timings are short enough to preclude any re-ignition of the plasma sheath even if there is total collapse of the plasma sheath and/or to prevent total collapse of the plasma sheath).

The above operations for flow diagram 1000 may be modified to provide for an additional plasma off state (e.g., in addition to the plasma off state generated during the first state [S0]). In particular, at 1060, the method includes adding a fourth state (S0') that is configured for additional negative ion transportation that is utilized for charge neutralization of the feature. Further, at 1070, the method includes continually rotating between the first state (S0), the second state (S2), the third state (S1), and the fourth state (S0'). A more detailed description of using multiple off states is provided below in relation to FIGS. 12A-12B.

Figure 11A:
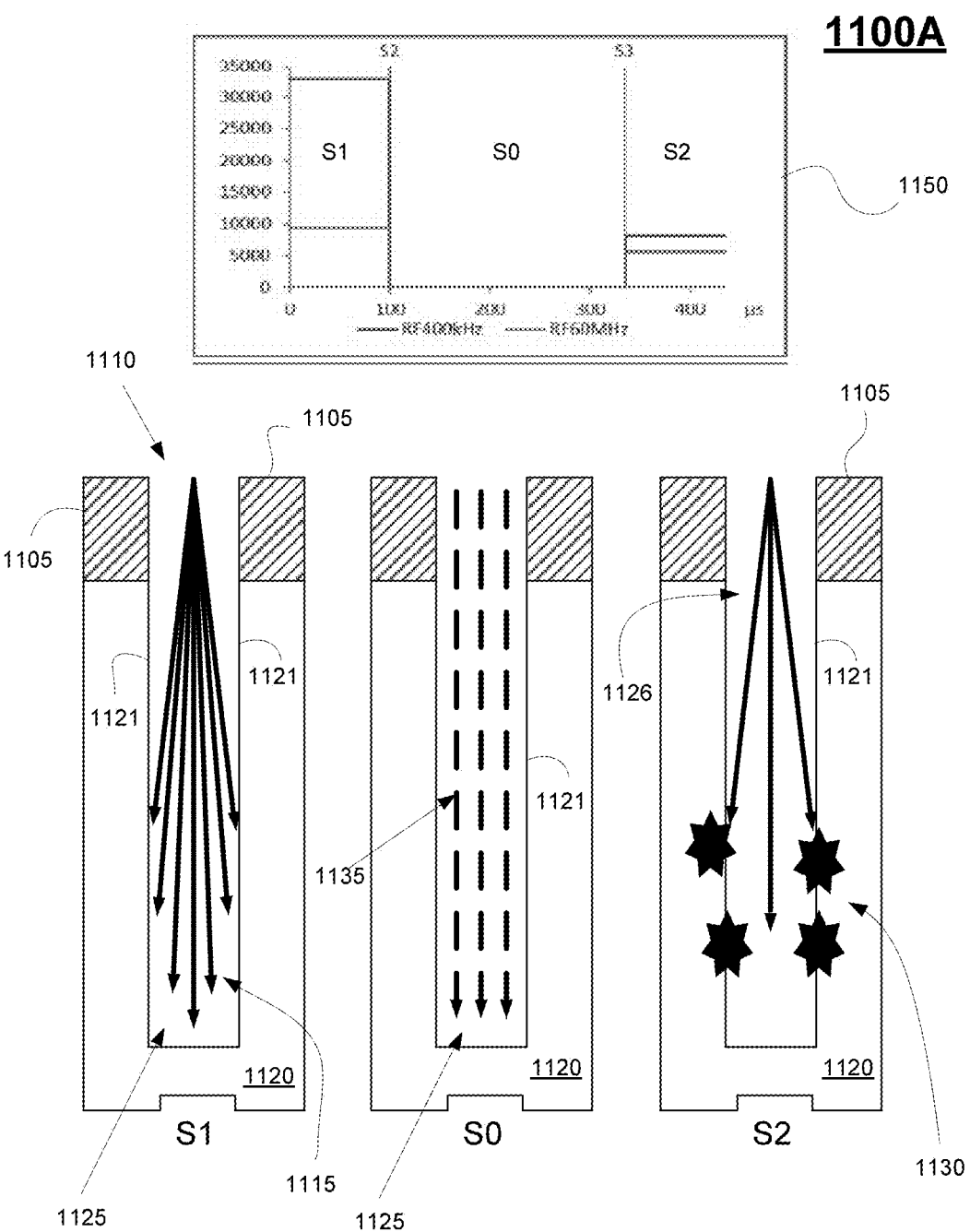
FIG. 11A is a diagram illustrating a cycling recipe in a multi-state pulsing process with three pulsed RF power states including one plasma OFF state for etching a feature in a stack including dielectric material such as when fabricating a 3D NAND structure on a substrate, in accordance with one embodiment of the present disclosure.

FIG. 11A is a diagram illustrating a cycling recipe in a multi-state pulsing process with three pulsed RF power states including one plasma off state for etching a feature in a stack including dielectric material, such as when fabricating a 3D NAND structure on a substrate, in accordance with one embodiment of the present disclosure. The operations shown in FIG. 11A form one implementation of the mixed-mode, multi-state RF pulsing with one plasma off state when performing etching of a feature in a stack of dielectric material formed over a masked substrate, in accordance with one embodiment of the present disclosure. For example, the operations shown in FIG. 11A may be one implementation of the method of flow diagram 1000.

As shown, diagram 1100A includes multiple RF power states S1 (peak power state). S0 (plasma off state), and S2 (passivation state) that are applied using the etching chemistry to perform etching of feature 1110. In general, the etching process is performed on a stack of dielectric material 1120 (e.g., oxide-nitride-oxide layers, oxide layers, etc.) formed over a substrate (not shown), and a mask layer 1105 that overlays the stack 1120. A power diagram 1150 showing power levels for each of a high frequency RF signal (e.g., 60 MHz in a particular case) and a low frequency RF bias signal (e.g., 400 kHz in a particular case) for each of the RF power states used for the RF power states performed in a multi-state pulsing process with three pulsed RF power states including one plasma OFF state for performing etching, and with more detail in FIG. 11B.

The RF power states S0, S1, and S2 are continually rotated for a period of time. The order of the RF power states is selectable, and in one particular case, the RF power states are pulsed in an order with RF power state S0 following RF power state S1, and RF power state S2 following RF power state S0.

Control parameters for the peak power RF power state S1 are tuned to provide for ion bombardment of the feature 1110. In general, the power levels for each of the high frequency RF signal and a low frequency RF bias signal are relatively high (i.e., when compared to the power levels applied in the other RF power states) to perform etching using the etching chemistry. That is, the power level for the high frequency RF signal is relatively high to provide for peak plasma density, and the power level for the low frequency RF bias signal is also relatively high to provide for peak ion bombardment. For instance, ions 1115 are shown sweeping down the sidewalls 1121 and bombarding the bottom portion 1125 of the feature 1110.

Control parameters for the RF power state S2 are tuned to provide for passivation of the feature 1110. That is, the power levels for each of the high frequency RF signal and a low frequency RF bias signal are tuned to provide for higher ion flux (i.e., higher RF power for the high frequency RF signal and lower RF bias power for the low frequency RF signal to provide for higher plasma density), which results in passivation of the sidewalls 1121 of the feature 1110. In addition, second ion generation may occur within the feature 1110 during operation of RF power state S2. Specifically, ions and/or electrons that strike the sidewalls 1121 may generate additional and/or secondary electrons 1130 through secondary emission. These secondary electrons may remain within the feature 1110 or may be accelerated back up towards the plasma.

Control parameters for the RF power state S0 are tuned to provide for electron transport trajectory and/or negative ion transportation from the plasma down into the feature, such as towards the bottom portion 1125 of feature 1110. In particular, the electron transport trajectory and/or negative ion transportation occurs due to the collapse of the plasma, as previously described. The presence of electron transport trajectory and/or negative ion transportation is shown by the dashed lines 1135 within the RF power state S0 and illustrates how electrons and/or negative ions from the plasma and/or secondary electrons (i.e., generated through secondary emission) flow down through the feature 1110 from the top portion 1126 to the bottom portion 1125. In addition, secondary electrons generated during RF power state S2 that may be present within the feature are also transported towards the bottom portion 1125 of the feature 1110.

As the electrons are transported through the feature 1110, the electrons and/or negative ions from the plasma and/or secondary electrons (e.g., generated through secondary emission) may neutralize any charge (e.g., positive charge) that has accumulated in the feature. For example, charge that may have accumulated near the top portion 1126 of the feature during etching of the feature 1110, and/or any other charge that has accumulated within the feature, are neutralized, thereby reducing defects within the feature (e.g., mouse bites, line wiggling, etc.). Little or no passivation occurs during RF power state S0, as would normally occur during traditional processes, and passivation occurs during the RF power state S2, as previously described.

Figure 11B:
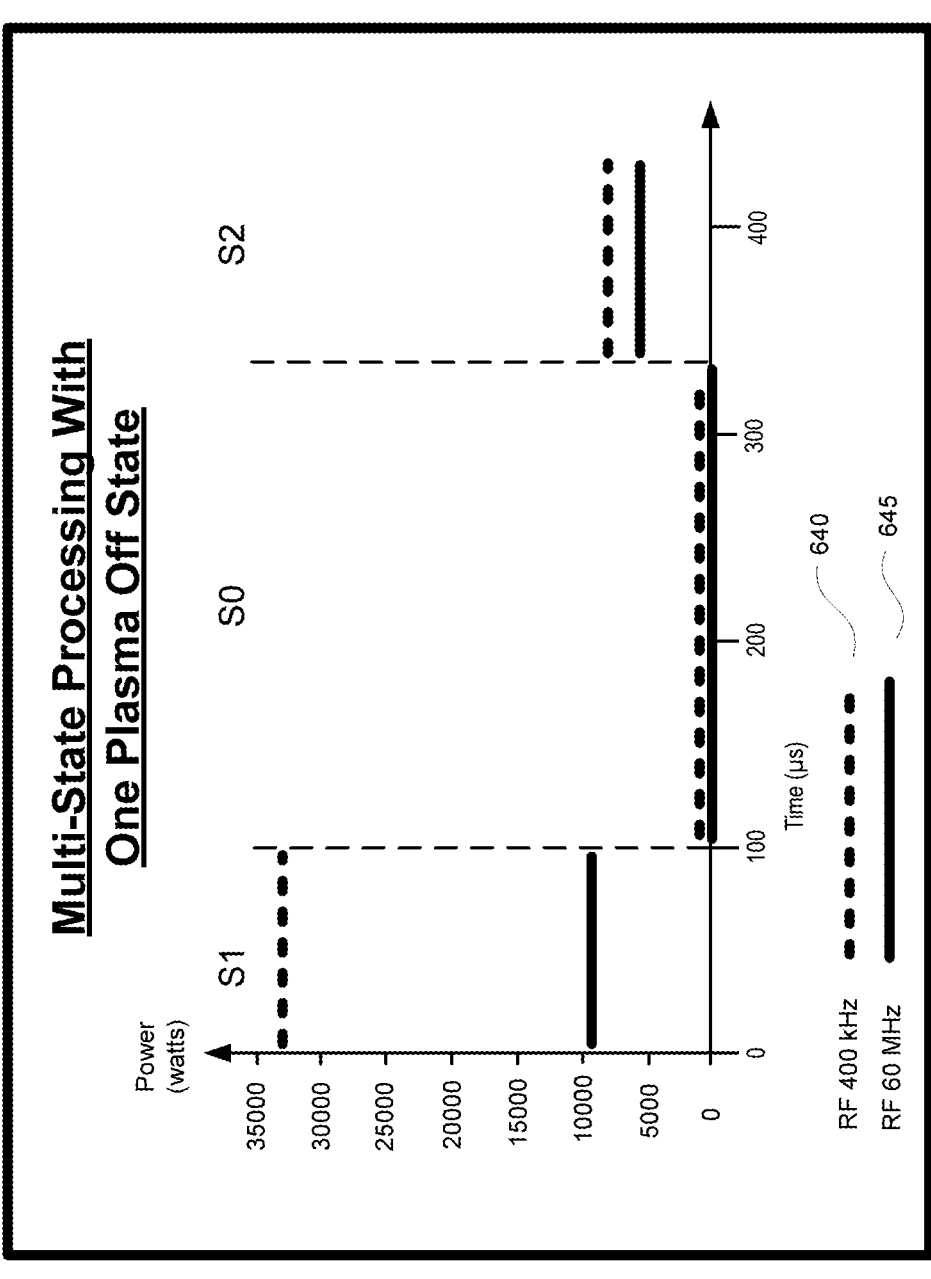
FIG. 11B is a diagram illustrating power levels applied during a multi-state pulsing process of FIG. 11A for etching a feature in a stack including dielectric material such as when fabricating a 3D NAND structure on a substrate, in accordance with one embodiment of the present disclosure.

FIG. 11B is a diagram 1150 illustrating power levels applied during a multi-state pulsing process of FIG. 11A for etching a feature in a stack including dielectric material, such as when fabricating a 3D NAND structure on a substrate, in accordance with one embodiment of the present disclosure. Power level diagram 1150 may be an illustration of the RF power levels applied when performing the etch cycle of FIG. 11A, but also are illustrative of RF power levels applied when performing any of a number of multi-state pushing techniques with one or more plasma off states that are used for etching. More particularly, the RF power levels include a high frequency RF signal 645 (shown as a solid line), which is generally used for controlling and/or generating a plasma, and in a particular case is generated at 60 MHZ. Also, the RF power levels include a low frequency RF bias signal 640 (shown as a dashed line), which is generally used for controlling ion bombardment of a feature, and in a particular case is generated at 400 KHz.

In various implementations, the following conditions may be applied to generate the plasma. The plasma may be generated using the high frequency RF signal 645 that is generated using an RF power source at a frequency between about 13-169 MHZ, for example between about 20-100 MHZ (e.g., 60 MHz in a particular case), and at a power level between about 0 watts (W) to 15 kilowatts (KW), or between about 0 W to 10 KW, or between about 250 W to 10 KW, or between about 500 W to 10 KW. In one embodiment, a plasma is generated using the high frequency RF signal 645 at a frequency of 60 MHZ, at a power level between about 500 W and 10 KW.

In addition, a bias (e.g., RF bias power) may be applied to the substrate using a low frequency RF bias signal 640, for example to promote a high vertical etch rate. The RF bias power may be applied to the substrate at a frequency between about 20 kHz and 1.5 MHZ, or between about 200 kHz and 1.5 MHZ, or between about 300 kHz and 600 kHz (e.g., about 400 kHz in a particular case), and at a power level between about 0 watts (W) to 50 kilowatts (kW), between about 250 W to 45 KW, between about 500 W to 35 KW. In various cases, the power level of the RF bias power used to generate the plasma may be particularly high, for example about 5 KW or greater, or 6 kW or greater, or 10 KW or greater, or 20 KW or greater, or 30 KW or greater. In one embodiment, the substrate is biased at 400 kHz, at a power level between about 500 W and 40 kW.

Power diagram 1150 illustrates the RF power levels for a corresponding etch cycle, wherein the x-axis is time, and the y-axis is the power level (e.g., expressed in watts). As previously described, the RF power states (e.g., S0, S1, and S2) in the etch cycle are continually rotated for a period of time. Each RF power state may last or be pulsed between tens to hundreds of milliseconds. For example, the pulsing period for RF power state S1 may be between 0 and 300 microseconds, the pulsing period for the RF power state S0 may be between 0 and 400 microseconds, and the period for RF power state S2 may be between 0 and 300 microseconds. The period of time for the etch may last between 400 to 800 microseconds. In one embodiment, the duty cycle associated with the continual cycling and/or rotating between the RF power states S0, S1, and S2 ranges from between 5 to 80.

Figure 12A:
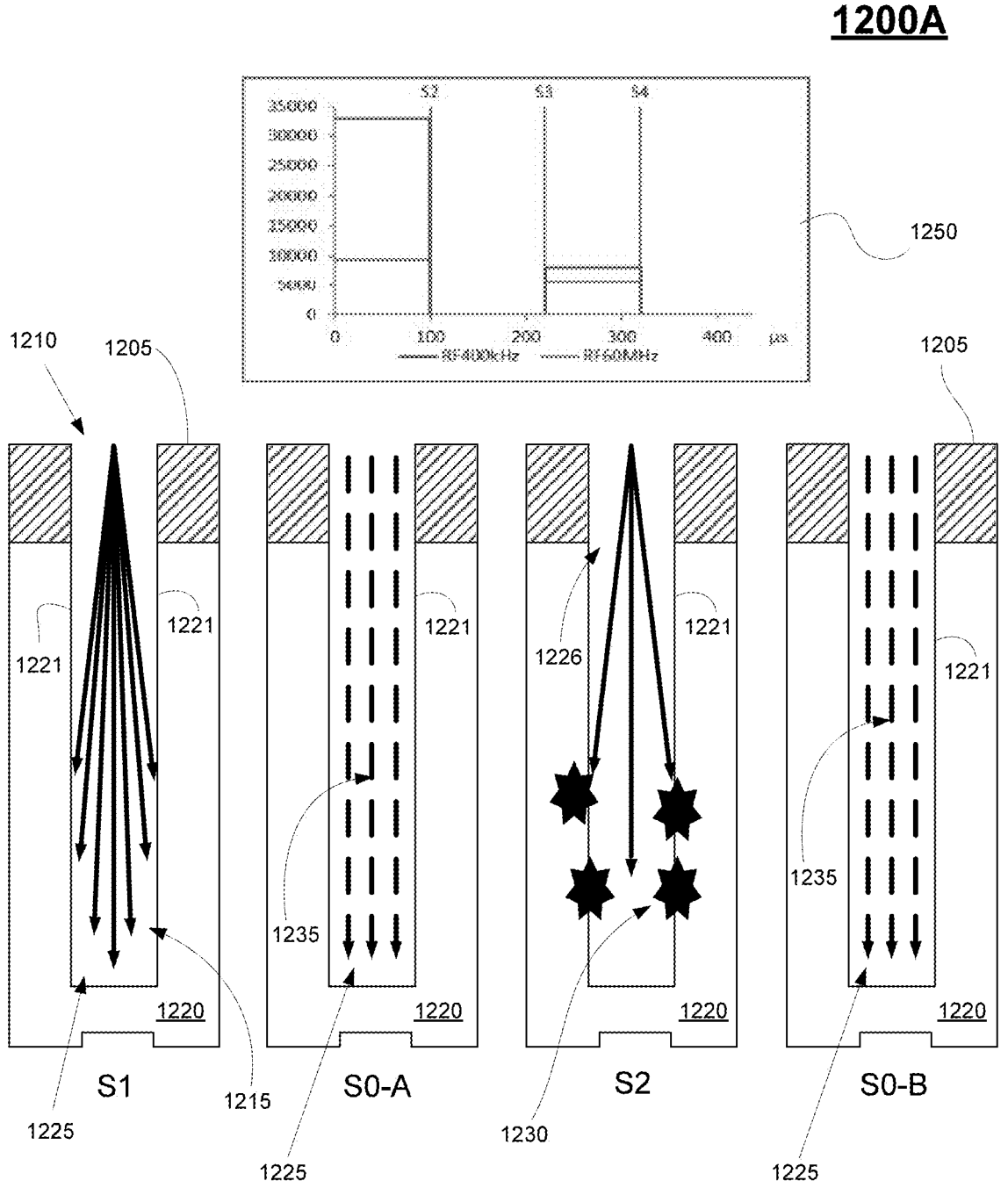
FIG. 12A is a diagram illustrating a cycling recipe in a multi-state pulsing process with four pulsed RF power states including two plasma OFF states for etching a feature in a stack including dielectric material such as when fabricating a 3D NAND structure on a substrate, in accordance with one embodiment of the present disclosure.

FIG. 12A is a diagram illustrating a cycling recipe in a multi-state pulsing process with four pulsed RF power states including two plasma off states for etching a feature in a stack including dielectric material such as when fabricating a 3D NAND structure on a substrate, in accordance with one embodiment of the present disclosure. As previously described, operations in flow diagram 1000 may be modified to provide for an additional plasma OFF state (e.g., in addition to the plasma off state generated during the first state [S0] of FIG. 11A). The operations shown in FIG. 12A form one implementation of the mixed-mode, multi-state RF pulsing with two plasma off states when performing etching of a feature in a stack of dielectric material formed over a masked substrate, in accordance with one embodiment of the present disclosure. For example, the operations shown in FIG. 12A may be one implementation of the method of flow diagram 1000.

As shown, diagram 1200A includes multiple RF power states S1 (peak power state). S0-A and S0-B (plasma off states), and S2 (passivation state) that are applied using the etching chemistry to perform etching of feature 1210. In general, the etching process is performed on a stack of dielectric material 1220 (e.g., oxide-nitride-oxide layers, oxide layers, etc.) formed over a substrate (not shown), and a mask layer 1205 that overlays the stack 1220. A power diagram 1250 showing power levels for each of a high frequency RF signal (e.g., 60 MHz, in a particular case) and a low frequency RF bias signal (e.g., 400 kHz in a particular case) for each of the RF power states used for the RF power states performed in a multi-state pulsing process with three pulsed RF power states including two plasma off states for performing etching, and with more detail in FIG. 12B.

The RF power states S0-A, S0-B, S1, and S2 are continually rotated for a period of time. The order of the RF power states is selectable, and in one particular case, the RF power states are pulsed in an order with RF power state S0-A following RF power state S1, and RF power state S2 following RF power state S0-A, and RF power state S0-B following RF power state S2.

As previously described, control parameters for the peak power RF power state S1 are tuned to provide for ion bombardment of the feature 1110. In general, the power levels for each of the high frequency RF signal and a low frequency RF bias signal are relatively high (i.e., when compared to the power levels applied in the other RF power states) to perform etching using the etching chemistry. That is, the power level for the high frequency RF signal is relatively high to provide for peak plasma density, and the power level for the low frequency RF bias signal is also relatively high to provide for peak ion bombardment. For instance, ions 1215 are shown sweeping down the sidewalls 1221 and bombarding the bottom portion 1225 of the feature 1210.

Control parameters for the RF power state S2 are tuned to provide for passivation of the feature 1210. That is, the power levels for each of the high frequency RF signal and a low frequency RF bias signal are tuned to provide for higher ion flux (i.e., higher RF power for the high frequency RF signal and lower RF bias power for the low frequency RF signal to provide for higher plasma density), which results in passivation of the sidewalls 1221 of the feature 1210. In addition, second ion generation may occur within the feature 1210 during operation of RF power state S2. Specifically, ions and/or electrons that strike the sidewalls 1221 may generate additional and/or secondary electrons 1230 through secondary emission. These secondary electrons may remain within the feature 1210 or may be accelerated back up towards the plasma.

Control parameters for each of the RF power states S0-A and S0-B are similarly tuned to provide for electron transport trajectory and/or negative ion transportation from the plasma down into the feature, such as towards the bottom portion 1225 of feature 1210. In particular, the electron transport trajectory and/or negative ion transportation occurs due to the collapse of the plasma, as previously described. The presence of electron transport trajectory and/or negative ion transportation is shown by the dashed lines 1235 within the RF power states S0-A and S0-B and illustrate how electrons and/or negative ions from the plasma and/or secondary electrons (i.e., generated through secondary emission) flow down through the feature 1210 from the top portion 1226 to the bottom portion 1225. In addition, secondary electrons generated during RF power state S2 that may be present within the feature are also transported towards the bottom portion 1225 of the feature 1210.

In particular, the fourth state (S0-B) or second off state is configured for additional negative ion transportation. In one embodiment, the RF off state S0 in FIG. 11A may be split in half to create RF power off states S0-A and S0-B. More particularly, the electron transport trajectory and/or negative ion transportation is utilized for additional charge neutralization of the feature. In that manner, instead of discharging the feature once during the etching process (i.e., as shown in FIG. 11A), the feature is discharged twice when performing RF power off states S0-A and S0-B. Adding one or more additional off states provides for more discharge of the feature during an etch cycle. This is because even though an RF power off state S0 sub-period may be relatively long, the discharge is occurring within a small portion of the sub-period (e.g., discharge occurring in the first tens of milliseconds of the sub-period). By adding another RF power OFF state S0-B, this allows for more discharge of the feature during an etch cycle (S0-A. S0-B, S1, and S2).

As previously described, in the plasma off states S0-A and S0-B, as the electrons are transported through the feature 1210, the electrons and/or negative ions from the plasma and/or secondary electrons (e.g., generated through secondary emission) may neutralize any charge (e.g., positive charge) that has accumulated in the feature. Little or no passivation occurs during RF power states S0-A and/or S0-B, as would normally occur during traditional processes, and passivation occurs during the RF power state S2, as previously described.

Figure 12B:
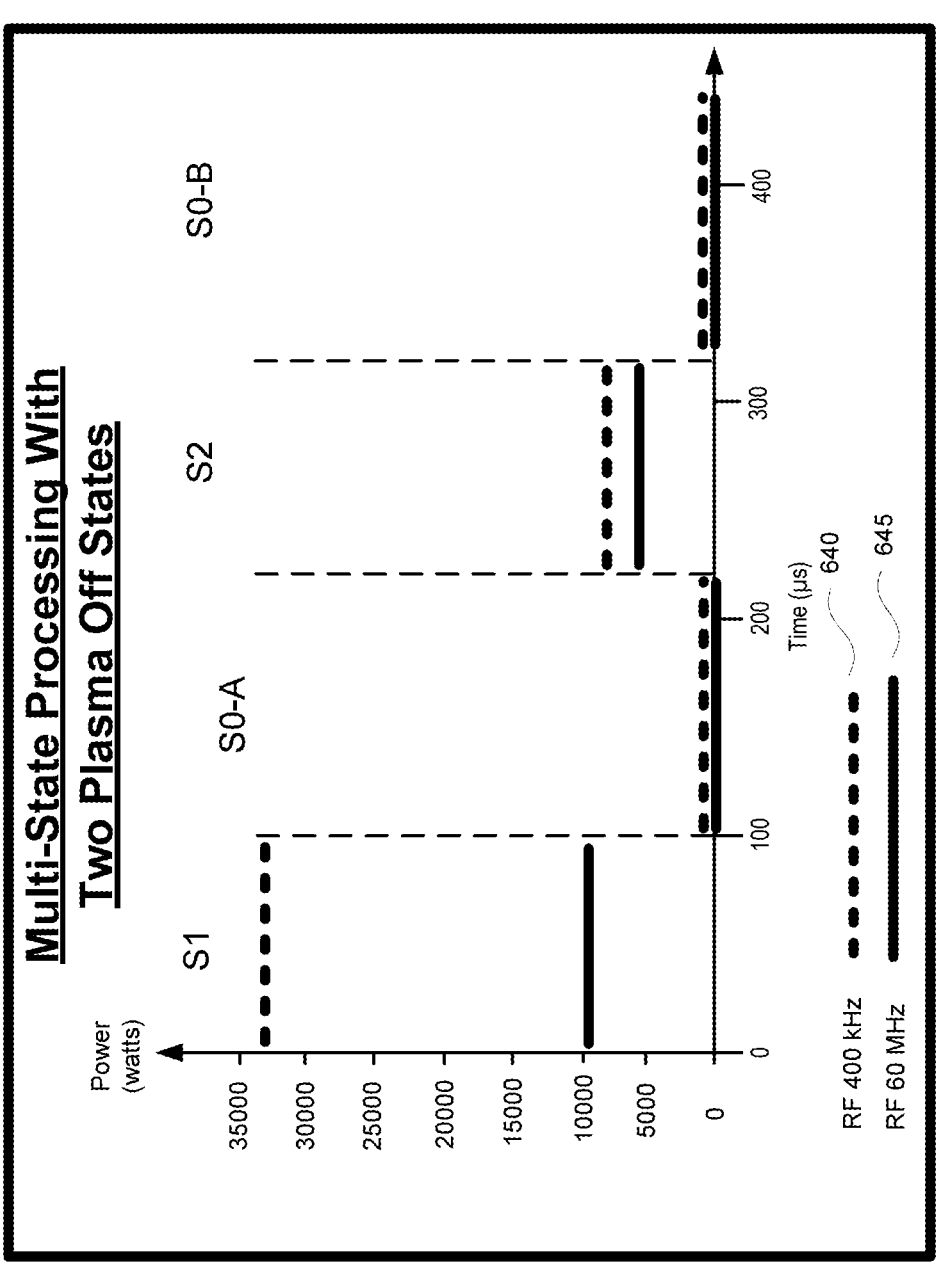
FIG. 12B is a diagram illustrating power levels applied during a multi-state pulsing process of FIG. 12A for etching a feature in a stack including dielectric material such as when fabricating a 3D NAND structure on a substrate, in accordance with one embodiment of the present disclosure.

FIG. 12B is a diagram 1250 illustrating power levels applied during a multi-state pulsing process of FIG. 12A for etching a feature in a stack including dielectric material, such as when fabricating a 3D NAND structure on a substrate, in accordance with one embodiment of the present disclosure. Power level diagram 1250 may be illustrative of RF power levels applied when performing any of a number of multi-state pushing techniques with one or more plasma off states that are used for etching. More particularly, the RF power levels include a high frequency RF signal 645 (shown as a solid line), which is generally used for controlling and/or generating a plasma, and in a particular case is generated at 60 MHZ. Also, the RF power levels include a low frequency RF bias signal 640 (shown as a dashed line), which is generally used for controlling ion bombardment of a feature, and in a particular case is generated at 400 KHz.

In various implementations, the following conditions may be applied to generate the plasma. The plasma may be generated using the high frequency RF signal 645 that is generated using an RF power source at a frequency between about 13-169 MHZ, for example between about 20-100 MHZ (e.g., 60 MHz in a particular case), and at a power level between about 0 watts (W) to 15 kilowatts (KW), or between about 0 W to 10 KW, or between about 250 W to 10 KW, or between about 500 W to 10 KW. In one embodiment, a plasma is generated using the high frequency RF signal 645 at a frequency of 60 MHZ, at a power level between about 500 W and 10 KW.

In addition, a bias (e.g., RF bias power) may be applied to the substrate using a low frequency RF bias signal 640, for example to promote a high vertical etch rate. The RF bias power may be applied to the substrate at a frequency between about 20 kHz and 1.5 MHZ, or between about 200 kHz and 1.5 MHZ, or between about 300 kHz and 600 kHz (e.g., about 400 kHz in a particular case), and at a power level between about 0 watts (W) to 50 kilowatts (KW), between about 250 W to 45 KW, between about 500 W to 35

KW. In various cases, the power level of the RF bias power used to generate the plasma may be particularly high, for example about 5 KW or greater, or 6 kW or greater, or 10 KW or greater, or 20 kW or greater, or 30 kW or greater. In one embodiment, the substrate is biased at 400 kHz, at a power level between about 500 W and 40 kW.

Power diagram 1250 illustrates the RF power levels for a corresponding etch cycle, wherein the x-axis is time, and the y-axis is the power level (e.g., expressed in watts). As previously described, the RF power states (e.g., S0, S1, and S2) in the etch cycle are continually rotated for a period of time. Each RF power state may last or be pulsed between tens to hundreds of milliseconds. For example, the pulsing period for RF power state S1 may be between 0 and 300 microseconds, the pulsing period for each of the RF power states S0-A and S0-B may be between 0 and 200 microseconds, wherein a combined pulsing period for the RF power states S0-A and S0-B may be between 0 and 400 microseconds, and the period for RF power state S2 may be between 0 and 300 microseconds. The period of time for the etch may last between 400 to 800 microseconds. In one embodiment, the duty cycle associated with the continual cycling and/or rotating between the RF power states S0-A, S0-B, S1, and S2 ranges from between 5 to 80.

Figure 13:
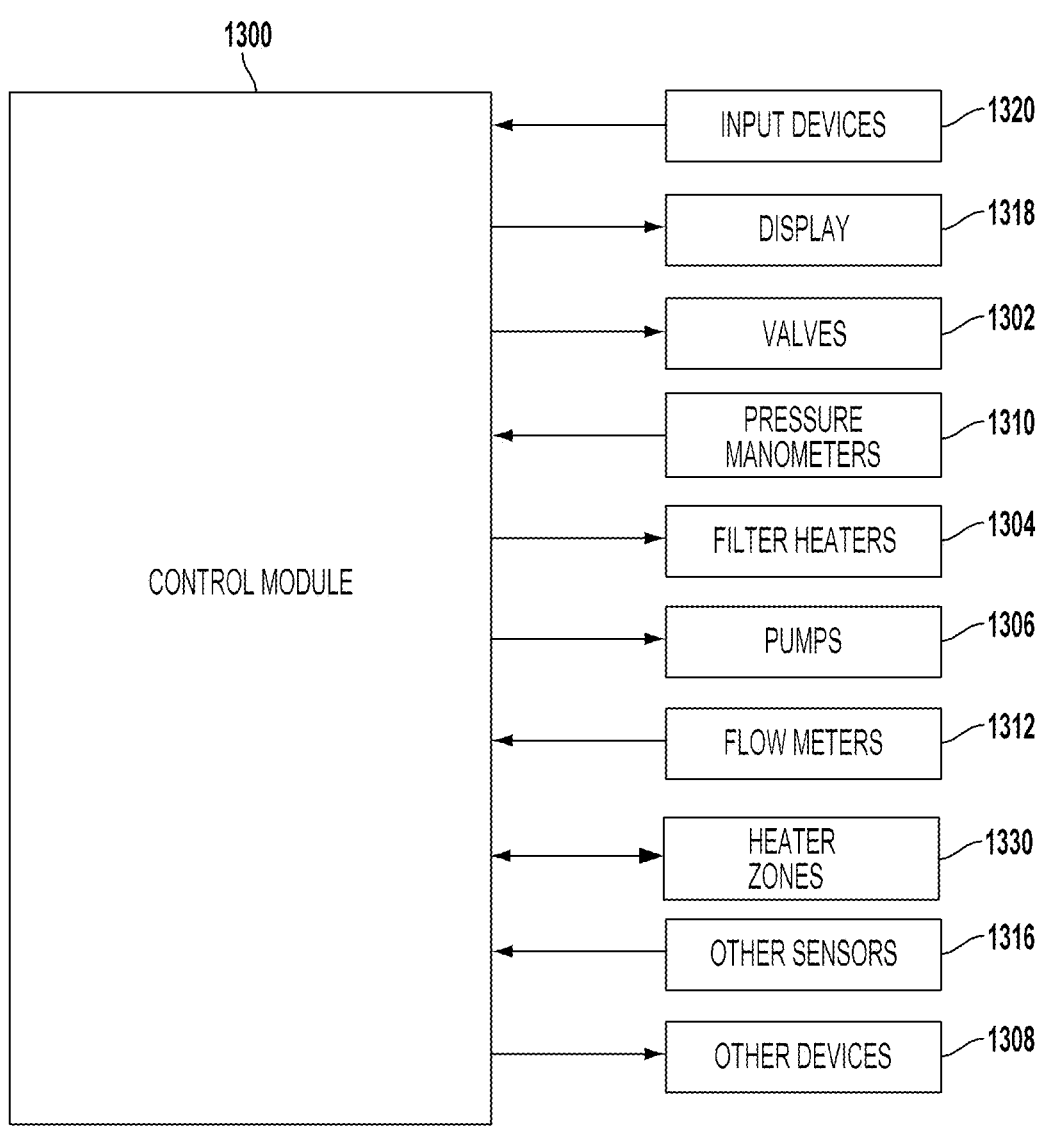
FIG. 13 shows a control module for controlling the systems described above.

FIG. 13 shows a control module 1300 for controlling the systems described above. For instance, the control module 1300 may include a processor, memory and one or more interfaces. The control module 1300 may be employed to control devices in the system based in part on sensed values. For example only, the control module 1300 may control one or more of valves 1302, filter heaters 1304, pumps 1306, and other devices 1308 based on the sensed values and other control parameters. The control module 1300 receives the sensed values from, for example only, pressure manometers 1310, flow meters 1312, temperature sensors 1314, and/or other sensors 1316. The control module 1300 may also be employed to control process conditions during precursor delivery and deposition of the film. The control module 1300 will typically include one or more memory devices and one or more processors. In one implementation, control module 1300 may include the control module 110 of FIG. 1.

The control module 1300 may control activities of the precursor delivery system and deposition apparatus. The control module 1300 executes computer programs including sets of instructions for controlling process timing, delivery system temperature, and pressure differentials across the filters, valve positions, mixture of gases, chamber pressure, chamber temperature, substrate temperature, RF power levels, substrate chuck or pedestal position, delivery of purge gases, and other parameters of a particular process. The control module 1300 may also monitor the pressure differential and automatically switch vapor precursor delivery from one or more paths to one or more other paths. Other computer programs stored on memory devices associated with the control module 1300 may be employed in some embodiments.

Typically there will be a user interface associated with the control module 1300. The user interface may include a display 1318 (e.g., a display screen and/or graphical software displays of the apparatus and/or process conditions), and user input devices 1320 such as pointing devices, keyboards, touch screens, microphones, etc.

Computer programs for controlling delivery of precursor, deposition and other processes in a process sequence can be written in any conventional computer readable programming language: for example, assembly language, C, C++, Pascal, Fortran or others. Compiled object code or script is executed by the processor to perform the tasks identified in the program.

The control module parameters relate to process conditions such as, for example, filter pressure differentials, process gas composition and flow rates, purge gas flow rates, temperature, pressure, plasma conditions such as RF power levels and the low frequency RF frequency, cooling gas pressure, and chamber wall temperature.

The system software may be designed or configured in many different ways. For example, various chamber component subroutines or control objects may be written to control operation of the chamber components necessary to carry out the inventive processes, including the delivery of purge gas. Examples of programs or sections of programs for this purpose include substrate positioning code, process gas control code, purge gas control code, pressure control code, heater control code, and plasma control code.

A substrate positioning program may include program code for controlling chamber components that are used to load the substrate onto a pedestal or chuck and to control the spacing between the substrate and other parts of the chamber such as a gas inlet and/or target. A process gas control program may include code for controlling gas composition and flow rates and optionally for flowing gas into the chamber prior to deposition in order to stabilize the pressure in the chamber. Purge gas control program may include code for controlling the delivery of purge gas. A filter monitoring program includes code comparing the measured differential(s) to predetermined value(s) and/or code for switching paths. A pressure control program may include code for controlling the pressure in the chamber by regulating, e.g., a throttle valve in the exhaust system of the chamber. A heater control program may include code for controlling the current to heating units for heating components in the precursor delivery system, the substrate and/or other portions of the system. Alternatively, the heater control program may control delivery of a heat transfer gas such as helium to the substrate chuck.

Examples of sensors that may be monitored during deposition include, but are not limited to, mass flow control modules, pressure sensors such as the pressure manometers 1310, and thermocouples located in delivery system, the pedestal or chuck, and state sensors 1320. Appropriately programmed feedback and control algorithms may be used with data from these sensors to maintain desired process conditions. The foregoing describes implementation of embodiments of the disclosure in a single or multi-chamber semiconductor processing tool.

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, delivery of purge gases, temperature settings (e.g., heating and/or cooling), pressure settings, vacuum settings, power settings, radio frequency (RF) generator settings. RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" of all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g., a server) can provide process recipes to a system over a network, which may include a local network or the Internet.

The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, a plasma enhanced chemical vapor deposition (PECVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within their scope and equivalents of the claims.

The invention claimed is:

1. A method for etching in plasma processing in a plasma chamber, comprising:

continually rotating between a first etch cycle and a second etch cycle for a period of time to etch a feature in a masked substrate;

performing the first etch cycle on the masked substrate using a first etching chemistry for a first sub-period; wherein the first etch cycle is continually rotated between a first state configured for passivation, a second state, and a third state configured for etching the masked substrate; wherein during the second state of the first etch cycle, a first tuning step is performed by tuning the first etching chemistry, a high frequency RF power and a low frequency RF power to provide extended passivation to the feature in the masked substrate;

performing the second etch cycle on the masked substrate using a second etching chemistry for a second sub-period: wherein the second etch cycle is continually rotated between the first state configured for passivation, a fourth state, and the third state configured for etching the feature in the masked substrate: wherein during the fourth state of the second etch cycle, a second tuning step is performed by tuning the second etching chemistry, the high frequency RF power, and the low frequency RF power to provide punch-through etching to the feature in the masked substrate.

2. The method of claim 1, wherein the additional passivation in the second state of the first etch cycle is performed on a top portion of a feature that is being etched.

3. The method of claim 1, further comprising:

increasing a power ratio of the low frequency RF power and the high frequency RF power between the second state of the first etch cycle and the fourth state of the second etch cycle.

4. The method of claim 3, wherein a first total power of the low frequency RF power and the high frequency RF power applied in the second state of the first etch cycle is approximately equal to a second total power of the low frequency RF power and the high frequency RF power applied in the fourth state of the second etch cycle.

5. The method of claim 1, wherein the first chemistry has a higher concentration of fluorocarbon gas than in the second chemistry, wherein the first chemistry has lower concentration of hydrocarbon fluorine gas than in the second chemistry.

6. The method of claim 1, further comprising:

in the first state of the first etch cycle and the second etch cycle, setting a low frequency RF power generator to a first off-state to prevent delivery of the low frequency RF power to the masked substrate;

in the first state of the first etch cycle and the second etch cycle, setting a high frequency RF power generator to a second off-state to prevent delivery of the high frequency RF power to the masked substrate.

7. The method of claim 1, further comprising:

in the second state of the first etch cycle, adding a third tuning step to complement the first tuning step, wherein the third tuning step includes tuning the second first etching chemistry, the high frequency RF power, and the low frequency RF power to provide punch-through etching to the feature in the masked substrate; and in the fourth state of the second etch cycle, adding a fourth tuning step to complement the second tuning step, wherein the fourth tuning step includes tuning the second etching chemistry, the high frequency RF power, and the low frequency RF power to provide additional passivation to the feature in the masked substrate.

8. The method of claim 7, wherein the third tuning step is performed after the first tuning step, and wherein the fourth tuning step is performed after the second tuning step.

9. The method of claim 7, wherein the third tuning step is performed before the first tuning step, and wherein the fourth tuning step is performed before the second tuning step.

10. The method of claim 1, further comprising:

in the first etch cycle, adding a third tuning step before the third state, wherein the third tuning step includes tuning the high frequency RF power and the low frequency RF power to provide punch-through etching to the feature in the masked substrate; and in the second etch cycle, adding a fourth tuning step before the third state, wherein the fourth tuning step includes tuning the high frequency RF power and the low frequency RF power to provide passivation to the feature in the masked substrate.

11. The method of claim 1, further comprising:

in the first etch cycle, adding a third tuning step after the third state, wherein the third tuning step includes tuning the high frequency RF power and the low frequency RF power to provide punch-through etching to the feature in the masked substrate; and in the second etch cycle, adding a fourth tuning step after the third state, wherein the fourth tuning step includes tuning the high frequency RF power and the low frequency RF power to provide passivation to the feature in the masked substrate.

12. A method for multi-state RF pulsing in plasma processing, comprising:

providing an etching chemistry to a plasma chamber; and continually rotating between a first state configured for negative ion transportation for charge neutralization of a feature, a second state, and a third state configured to etch the feature in a masked substrate including a stack of a plurality of layers and a mask layer that is patterned on top of the stack, wherein during the second state, the etching chemistry, a high frequency radio frequency (RF) power, and a low frequency RF bias power are tuned to provide passivation to the feature in the masked substrate, wherein during the third state, the etching chemistry, the high frequency RF power, and the low frequency RF bias power are tuned to etch the feature in the masked substrate, wherein during the first state, a low frequency RF power generator is set to a first off-state to prevent delivery of the low frequency RF power to the masked substrate, wherein during the first state, a high frequency RF power generator is set to a second off-state to prevent delivery of the high frequency RF power to the masked substrate.

13. The method of claim 12, wherein passivation is only performed during the second state.

14. The method of claim 13, wherein the etching chemistry, high frequency RF power, and low frequency RF bias power are tuned to provide slight etching to the feature in the second state.

15. The method of claim 12, wherein the continually rotating includes:

adding a fourth state configured for additional negative ion transportation for charge neutralization of the feature; and continually rotating between the first state, the second state, the third state, and the fourth state for a first sub-period of time.

16. The method of claim 15, wherein a duty cycle associated with the continually rotating between the first state, the second state, the third state, and the fourth state ranges from between 5 to 80.

17. The method of claim 12, wherein a duty cycle associated with the continually rotating between the first state, the second state, and the third state ranges from between 5 to 80.

18. A method for multi-state RF pulsing in plasma processing, comprising:

providing an etching chemistry to a plasma chamber; and continually rotating between a first state configured for negative ion transportation for charge neutralization of a feature, a second state, and a third state configured to etch the feature in a masked substrate, and a fourth state configured for additional negative ion transportation for charge neutralization of the feature, wherein during the second state, the etching chemistry, a high frequency radio frequency (RF) power, and a low frequency RF bias power are tuned to provide passivation to the feature in the masked substrate including a stack of a plurality of layers and a mask layer that is patterned on top of the stack, wherein during the third state, the etching chemistry, the high frequency RF power, and the low frequency RF bias power are tuned to etch the feature in the masked substrate, wherein during the first state (S0), a low frequency RF power generator is set to a first off-state to prevent delivery of the low frequency RF power to the masked substrate, wherein during the first state (S0) or the fourth state, a high frequency RF power generator is set to a second off-state to prevent delivery of the high frequency RF power to the masked substrate.

19. The method of claim 18, wherein passivation is only performed during the second state.

20. The method of claim 19, wherein the etching chemistry, high frequency RF power, and low frequency RF bias power are tuned to provide slight etching to the feature in the second state.

21. The method of claim 18, wherein a duty cycle associated with the continually rotating between the first state, the second state, the third state, and the fourth state ranges from between 5 to 80.

* * * * *